(12) United States Patent
Ma et al.

(10) Patent No.: US 7,835,173 B2
(45) Date of Patent: Nov. 16, 2010

(54) RESISTIVE MEMORY

(75) Inventors: Yantao Ma, Boise, ID (US); Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 114 days.

(21) Appl. No.: 12/262,223

(22) Filed: Oct. 31, 2008

(65) Prior Publication Data

US 2010/0110757 A1 May 6, 2010

(51) Int. Cl.
G11C 11/00 (2006.01)
(52) U.S. Cl. .................. 365/148; 365/100; 365/207
(58) Field of Classification Search ................. 365/148, 365/100, 207
See application file for complete search history.

(56) References Cited

U.S. PATENT DOCUMENTS

| 5,559,425 | A | 9/1996 | Allman |
| 5,680,038 | A | 10/1997 | Fiedler |
| 6,128,214 | A | 10/2000 | Kuekes et al. |
| 6,493,258 | B1 | 12/2002 | Lu et al. |
| 6,504,750 | B1 | 1/2003 | Baker |
| 6,724,654 | B1 | 4/2004 | Swanson et al. |
| 6,870,755 | B2 | 3/2005 | Rinerson et al. |
| 7,433,226 | B2 * | 10/2008 | Lung ........................... 365/158 |
| 2007/0132049 | A1 | 6/2007 | Stipe |
| 2007/0229166 | A1 | 10/2007 | Shor |
| 2008/0151611 | A1 | 6/2008 | Luo et al. |
| 2008/0165567 | A1 | 7/2008 | Rhie |

FOREIGN PATENT DOCUMENTS

WO 9316427 A1 8/1993

OTHER PUBLICATIONS

International Search Report and Written Opinion for related PCT Application No. PCT/US2009/005729, mailed Mar. 31, 2010 (12 pgs.).
Bedeschi, Ferdinando, et al. A Multi-Level-Cell Bipolar-Selected Phase-Change Memory, ISSCC 2008 Digest of Technical Papers, Session 23, Non-Volatile Memory, No. 23.5, pp. 428-429, 625.
Kawahara, T., et al. 2Mb Spin-Transfer Torque RAM (SPRAM) with Bit-by-Bit Bidirectional Current Write and Parallelizing-Direction Current Read, ISSCC 2007 Digest of Technical Papers, Session 26, Non-Volatile Memories, No. 26.5, pp. 480-481, 617.

* cited by examiner

Primary Examiner—Son Dinh
Assistant Examiner—Nam Nguyen
(74) Attorney, Agent, or Firm—Brooks, Cameron & Huebsch, PLLC

(57) ABSTRACT

The present disclosure includes resistive memory devices and systems having resistive memory cells, as well as methods for operating the resistive memory cells. One memory device embodiment includes at least one resistive memory element, a programming circuit, and a sensing circuit. For example, the programming circuit can include a switch configured to select one of N programming currents for programming the at least one resistive memory element, where each of the N programming currents has a unique combination of current direction and magnitude, with N corresponding to the number of resistance states of the at least one memory element. In one or more embodiments, the sensing circuit can be arranged for sensing of the N resistance states.

37 Claims, 8 Drawing Sheets

RESISTIVE MEMORY

TECHNICAL FIELD

The present disclosure relates generally to the field of semiconductor memory. More particularly, in one or more embodiments the present disclosure relates to a resistive memory and methods of operating resistive memory.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, and resistive random access memory (RRAM), such as magnetoresistive random access memory (MRAM; also referred to as magnetic random access memory) among others.

Memory devices are utilized as non-volatile memory for a wide range of electronic applications in need of high memory densities, high reliability, and low power consumption. Non-volatile memory may be used in a personal computer, a portable memory stick, a solid state drive (SSD), a personal digital assistant (PDA), a digital camera, a cellular telephone, a portable music player (e.g., MP3 player), a movie player, and other electronic devices, among others. Program code and system data, such as a basic input/output system (BIOS), are typically stored in non-volatile memory devices.

Memory cells can be arranged in a matrix (e.g., an array). For example, an access device (e.g., transistor) of a number of memory cells may be coupled to an access line (one example of which is a "word line") forming a "row" of the array. The memory elements of each memory cell are coupled to a data line (one example of which is a "bit line") in a "column" of the array. In this manner, the access device of a memory cell is accessed through a row decoder activating a row of memory cells by selecting the word line coupled to their gates. The programmed state of a row of selected memory cells is determined by causing different currents to flow in the memory elements depending on the resistance associated with a programmed state for a particular memory cell.

Memory cells can be programmed (e.g., erased) to a desired state. That is, one of a number of programmed (e.g., resistance) states can be set for a memory cell. For example, a single level cell (SLC) can represent one of two logic states (e.g., 1, 0). Resistive memory cells can also be programmed to one of more than two programmed states, such as to represent more than two binary digits (e.g., 1111, 0111, 0011, 1011, 1001, 0001, 0101, 1101, 1100, 0100, 0000, 1000, 1010, 0010, 0110, 1110). Such cells may be referred to as multi state memory cells, multi-digit cells, or multilevel cells (MLCs).

Non-volatile resistive memory such as resistive random access memory (hereinafter, "RRAM"), stores data by varying the resistance of a resistive memory element. Data may be written to a selected memory cell in an RRAM by applying a predetermined current to the corresponding resistive element. Bi-polar RRAM can be programmed to a number of resistance states by current of various magnitudes flowing in one direction and to a number of additional resistance states by current of various magnitudes flowing in an opposite direction. Resistance states may be programmed in accordance with a linear distribution, or a non-linear distribution.

Magnetoresistive (sometimes shortened to "magnetic") random access memory (MRAM) utilizes magnetic storage elements to provide a high density, low cost, non-volatile, high speed RAM without the read/write cycle endurance limitations of charge-storage type memory. One type of MRAM utilizes the magnetic field generating current flowing in an adjacent conductor to control orientation of magnetic moments in magnetic material. Spin torque transfer (STT) MRAM controls orientation of magnetic moments in magnetic material by passing current through a magnetic structure (e.g., magnetic spin valve, magnetic tunnel junction (MTJ)) such that the magnetic moment of the electrons in the current are first polarized to a particular orientation by one portion of the magnetic structure, which then can transfer the particular orientation to another portion of the magnetic structure.

DETAILED DESCRIPTION

Figure 1:
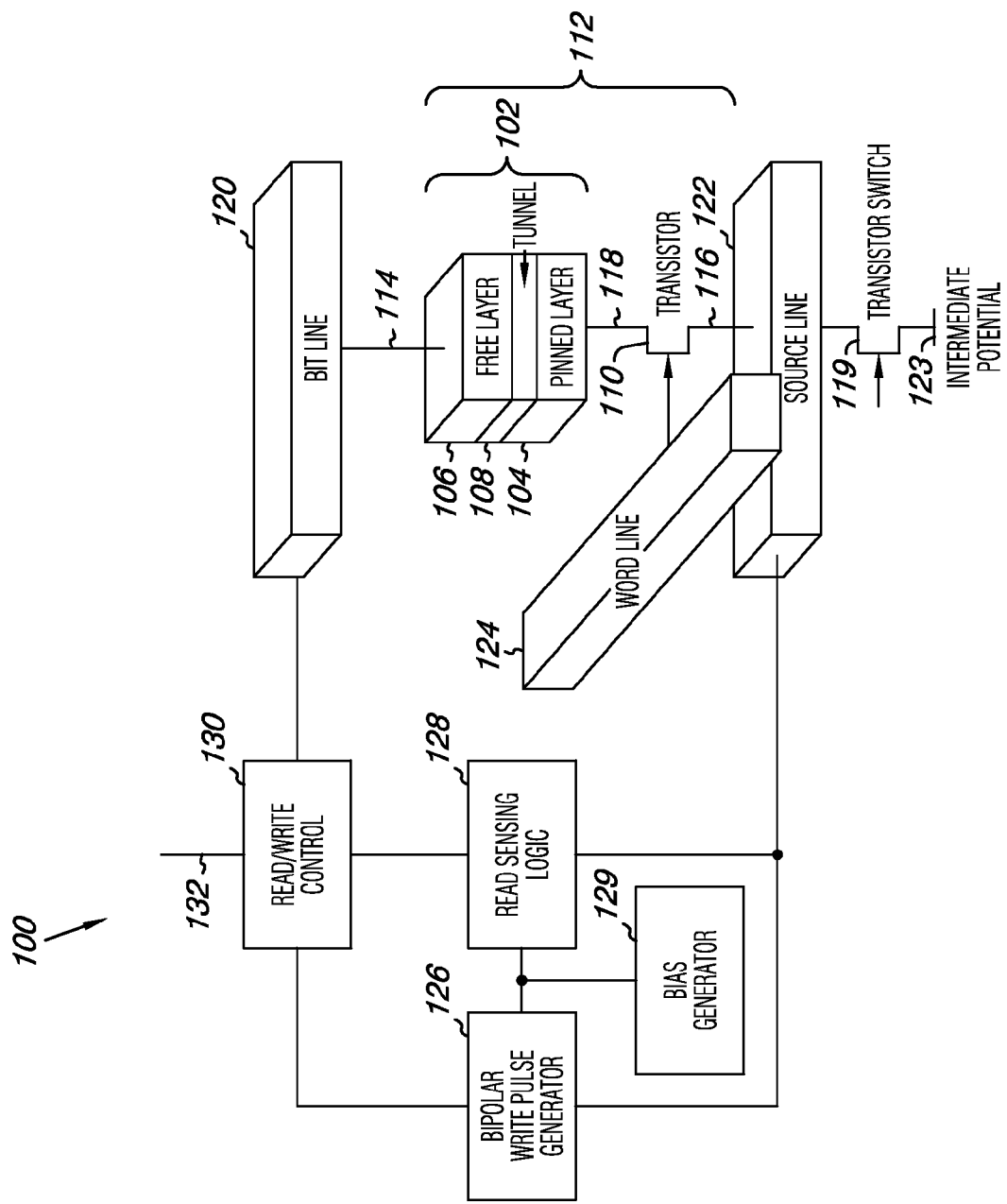
FIG. 1 is a functional block diagram of a non-volatile memory in accordance with one or more embodiments of the present disclosure.

The present disclosure includes resistive memory devices and systems having resistive memory cells, as well as methods for operating the resistive memory cells. One memory device embodiment includes at least one resistive memory element, a programming circuit, and a sensing circuit. For example, the programming circuit can include a switch configured to select one of N programming currents for programming the at least one resistive memory element, where each of the N programming currents has a unique combination of current direction and magnitude, with N corresponding to the number of resistance states of the at least one memory element. In one or more embodiments, the sensing circuit can be arranged for sensing of the N resistance states.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202A in FIG. 2A and 302 in FIG. 3, etc.

FIG. 1 is a functional block diagram of a non-volatile memory 100 in accordance with one or more embodiments of the present disclosure. As shown in FIG. 1, a resistive memory element 102 may be formed by a magnetic structure (e.g., magnetic spin valve, magnetic tunnel junction (MTJ)). The magnetic structure can include a pinned layer 104 and free layer 106 separated by a tunnel barrier 108. Resistive memory element 102 has a first terminal 114 and a second terminal 118. While FIG. 1 shows the first terminal 114 directly coupled to the free layer 106, and the second terminal 118 directly coupled to the pinned layer 104, embodiments of the present disclosure are not so limited. For example, embodiments of the present disclose may be implemented with additional layers and/or features (e.g., a discrete antimagnetic layer), which are omitted from FIG. 1 for clarity.

An access device (e.g., transistor) 110 is coupled in series with the resistive memory element 102 to form a memory cell 112. Access device 110 serves as a switch for enabling and disabling current flow through the resistive memory element 102. Access device 110 may be, for example, a complementary metal oxide semiconductor (CMOS) transistor with a gate coupled to a word line 124. Thus, when word line 124 is energized, access device 110 is turned on, thereby completing the circuit between a source line 122 and a bit line 120 through the memory element 102. Memory cell 112 is coupled to the bit line 120 by a first terminal 114, and coupled to the source line 122 by a second terminal 116. The source line 122 may be switchably coupled (e.g., by a switch such as a transistor switch 119) to an intermediate potential 123 (e.g., of the source providing read and/or write currents).

According to one or more embodiments, the bit line 120 and source line 122 are coupled to logic for reading and logic for writing. A read/write control multiplexer 130 has an output coupled to the bit line 120. The read/write control multiplexer 130 is controlled by a read/write control logic line 132 to select between a first input coupled to a bipolar write pulse generator 126, and a second input coupled to a read sensing logic 128. A bias generator 129 is coupled to each of the bipolar write pulse generator 126 and the read sensing logic 128, as shown in FIG. 1. The amount of current applied to the memory element 102 for programming may be controlled by applying a voltage potential between the bit line 120 and the source line 122 associated with the selected memory cell 112.

According to one or more embodiments, during a read operation, the bias generator 129 establishes (through the read sensing logic 128) a read bias voltage potential difference between the bit line 120 and the source line 122 (e.g., a fixed voltage) associated with the selected memory cell 112. The read bias voltage causes a particular magnitude of current to flow corresponding to the resistance of the memory element 102 (e.g., the greater the resistance of the memory element 102, the smaller the current that flows for a given read bias voltage according to Ohm's law). The amount of current flowing through the memory element 102 during a read operation (or a voltage proportional thereto) can be sensed by the read sensing logic 128 (e.g., a sense amp may compare a circuit-derived input to a reference input that corresponds to a boundary condition between two programmed states) to determine an output corresponding to the programmed state represented by the present resistance of the memory element 102.

According to one or more embodiments, a read current is applied through the resistive memory element 102 causing a corresponding voltage to be developed, which can be sensed and compared to a reference voltage. From the comparison, the resistance of the memory element may be determined (e.g., based on the principles of Ohm's law).

Although FIG. 1 illustrates, and the discussion above describes, a memory cell 112 including a magnetic structure as resistive memory element 102, one having ordinary skill in the art will appreciate that one or more embodiments of the present disclosure may be implemented using other types of resistive elements in place of the magnetic structure to form RRAM memory cells other than MRAM memory cells.

RRAM can include types of RRAM in which different data values may be written in accordance with the polarity (i.e., the directional flow) of the applied current through the resistive element. Such devices are sometimes referred to as a "bipolar RRAM." In the case of a bipolar RRAM, a bit line and source line are required for each memory cell in order to write different data values to the bipolar RRAM.

One having ordinary skill in the art will appreciate that RRAM cells may be implemented in a number of ways such that cell resistance may be programmed using current to different resistance states using current. One embodiment forms the memory element from a chalcogenide material. For example, phase change chalcogenide may be formed of various doped or undoped materials (e.g., Ge2Sb2Te5, Sb2Te3). Passing current of various magnitudes through the memory element changes the phase of the chalcogenide, and thus, its resistance. Ionic conducting chalcogenide may be formed of various materials (e.g., Ag-doped GeSe, GeS).

According to one or more embodiments, a binary metal oxide memory element may be formed from materials including HfOx, Nb2O5, Al2O3, WOx, Ta2O5, TiOx, ZrOx, CuxO, and/or NixO. A perovskite oxide memory element may be formed from various doped or undoped materials (e.g., SrTiO3, SrZrO3, BaTiO3).

The resistance properties (e.g., programmed states) of colossal magnetoresistive material can be changed without the application of magnetic fields. Colossal magnetoresistive memory elements may be formed of various materials (e.g., Pr(1−x)CaxMnO3 (PCMO), La(1−x)CaxMnO3 (LCMO), Ba(1−x)SrxTiO3).

Polymer molecular RRAM memory elements may be formed of Bengala Rose, AlQ3Ag, Cu-TCNQ, DDQ, TAPA, and/or Fluorescine-based polymer.

Figures 2A, 2B:
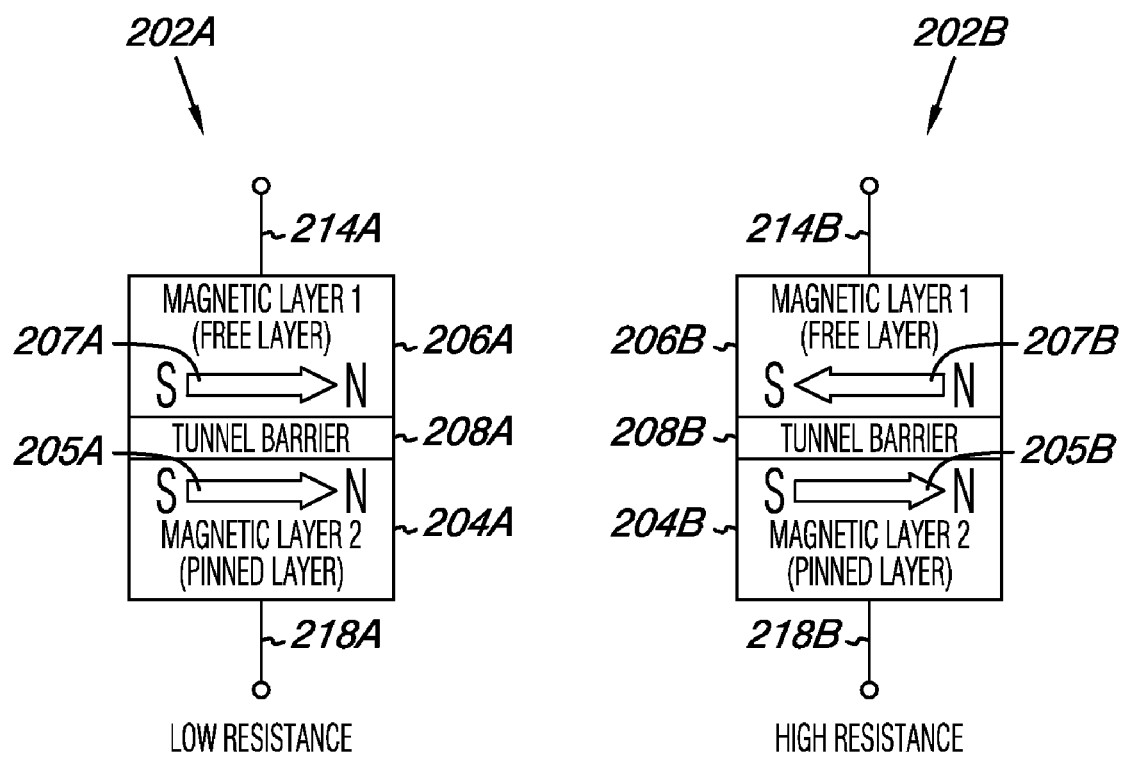
FIG. 2A illustrates an example magnetic structure in a low resistance state in accordance with one or more embodiments of the present disclosure.
FIG. 2B illustrates an example magnetic structure in a high resistance state in accordance with one or more embodiments of the present disclosure.

FIG. 2A illustrates an example magnetic structure in a low resistance state in accordance with one or more embodiments of the present disclosure. The magnetic structure 202A may be implemented, for example, as the resistive memory element 102 in FIG. 1. As shown in FIG. 2A, the magnetic structure 202A is composed of a first magnetic layer 206A (e.g., ferromagnetic layer) and a second magnetic layer 204A (e.g., ferromagnetic layer) separated by a tunnel barrier 208A (e.g., dielectric tunnel junction). By way of example, and not by way of limitation, materials that can be used to provide the first and the second magnetic layers 206A and 204A include Iron (Fe), Copper (Cu), Nickel (Ni), and alloys thereof, among others. The tunnel junction 208A can be a thin (e.g., approximately 10 Angstrom thick) oxide layer formed from Aluminum oxide (Al2O3), magnesium-oxide (MgO), or other suitable dielectric materials for forming a tunneling layer.

As mentioned in connection with the embodiment of FIG. 1, the first magnetic layer 206A is unpinned (e.g., "free") such that a polarization of an associated magnetization is able to rotate to a particular direction, as indicated by the directional arrow 207A. The second magnetic layer 204A is a fixed magnetic layer, as indicated by the directional arrow 205A (e.g., fixed in one direction). The pinned magnetic layer 204A acts as a reference. The magnetic moment of the free magnetic layer can be switched between a number (e.g., two) of stable directions by passing an appropriate magnitude current in a particular direction through the magnetic structure 202A.

When a bias is applied to the magnetic structure, electrons become spin polarized by the magnetic layers, and traverse the dielectric barrier through a process known as tunneling. Through spin torque transfer (STT), the polarized electrons polarize the magnetic moment of the free layer to one direction or another (depending on current flow direction). Current in a direction having electrons moving from the pinned layer to the free layer, and of sufficient magnitude, causes the magnetic moment of the free layer to orient in a direction parallel to the magnetic moment of the pinned layer. Current in the opposite direction (e.g., having electrons moving from the free layer to the pinned layer) and having sufficient magnitude, causes the magnetic moment of the free layer to orient in a direction anti-parallel to the magnetic moment of the pinned layer (by an electron reflection process that will be appreciated by one having ordinary skill in the art).

The magnetic structure has low resistance when the magnetic moment of the free layer is parallel to that of the pinned (e.g., fixed) layer, as shown in FIG. 2A. The magnetic structure has high resistance when the magnetic moment of the free layer is oriented opposite (e.g., anti-parallel) to the magnetic moment of the pinned (e.g., fixed) layer, as shown in FIG. 2B. This change in resistance corresponding to the various magnetic states of the magnetic structure device is known as magnetoresistance. The magnetoresistance structure used in MRAM is similar to the structure used for the read head of a magnetic hard drive.

Unlike charge-storage type memory (e.g., Flash), data is stored as a magnetic state rather than by charge stored in a floating gate. The magnetic state is sensed by measuring the resistance without disturbing the magnetic state. The magnetic state (e.g., polarization) does not leak away with time like charge can, so the information is stored even when the power to the device is turned off. Switching the magnetic polarization between states does not accumulate charge, and thus does not exhibit the same wear-out cycling limitations of charge-storage memory.

The pinned magnetic layer may be fixed, for example, by being in contact with a layer of anti-magnetic material (e.g., anti-ferromagnetic material—not shown for clarity). By way of example, and not by way of limitation, materials that can be used to provide the anti-magnetic layer include ferromagnetic alloys such as Iron-Manganese (FeMn), and/or other alloys such as Iridium-Manganese (IrMn), and Platinum-Manganese (PtMn). Contact between the second magnetic layer 204A and the anti-magnetic layer pins (e.g., "fixes") the second magnetic layer 204A to prevent a polarization of an associated magnetization from rotating.

According to states of magnetization in each magnetic layer (e.g., parallel, anti-parallel) resistance of the magnetic structure 202A and 202B can be changed based on spin torque transfer magnetization switching, for example. That is, the magnetic structure 202A and 202B can be programmed by magnetization reversal through an interaction of a spin momentum torque current and the magnetic moments in the first (e.g., 206A and 206B) and second (e.g., 204A and 204B) magnetic layers. When a current pulse is passed through the magnetic structure a torque is applied on the first (e.g., "free") magnetic layer's (e.g., 206A and 206B) magnetic moment due to the angular momentum carried by the spin polarized tunneling current. If the pulse current-density is large enough the free magnetic layer (e.g., 206A and 206B) will switch magnetic states. Hence, when a sufficiently negative potential is applied between the two terminals (e.g., 214A/B and 218A/B) of the magnetic structure (e.g., 202A and 202B) the magnetization of the first (e.g., 206A and 206B) and the second (e.g., 204A and 204B) magnetic layers transform from parallel (as shown in FIG. 2A) to anti-parallel (as shown in FIG. 2B), switching the magnetic structure 202B into a highest resistance level state (e.g., OFF state). Conversely, when a sufficiently opposite potential is applied the magnetization of the first and the second magnetic layers transform from anti-parallel to parallel, switching the magnetic structure 202A into a lowest resistance level state (e.g., ON state).

As shown in FIG. 2A, when the magnetic moments (e.g., magnetizations) are parallel as indicated by directional arrows 205A and 207A, the magnetic structure 202A will exhibit a lowest resistance value to current flow for a potential established between the terminals 214A and 218A. For description purposes herein, when the magnetic moments (e.g., magnetizations) are parallel (or substantially aligned) the magnetic structure 202A is referred to as storing data associated with a logic value "1."

By contrast, when the magnetic moments are anti-parallel, as indicated by direction arrows 205B and 207B, the magnetic structure 202B will exhibit a highest resistance value to current flow when a potential is established between the terminals 214B and 218B. For description purposes herein, when the magnetic moments (e.g., magnetizations) are anti-parallel the magnetic structure 202B is referred to as storing data associated with a logic value "0." As such, the magnetic structure can be regarded as a variable resistor (e.g., it can alternate between a first and a second resistance) and provides a non-volatile storage capability.

Figure 3:
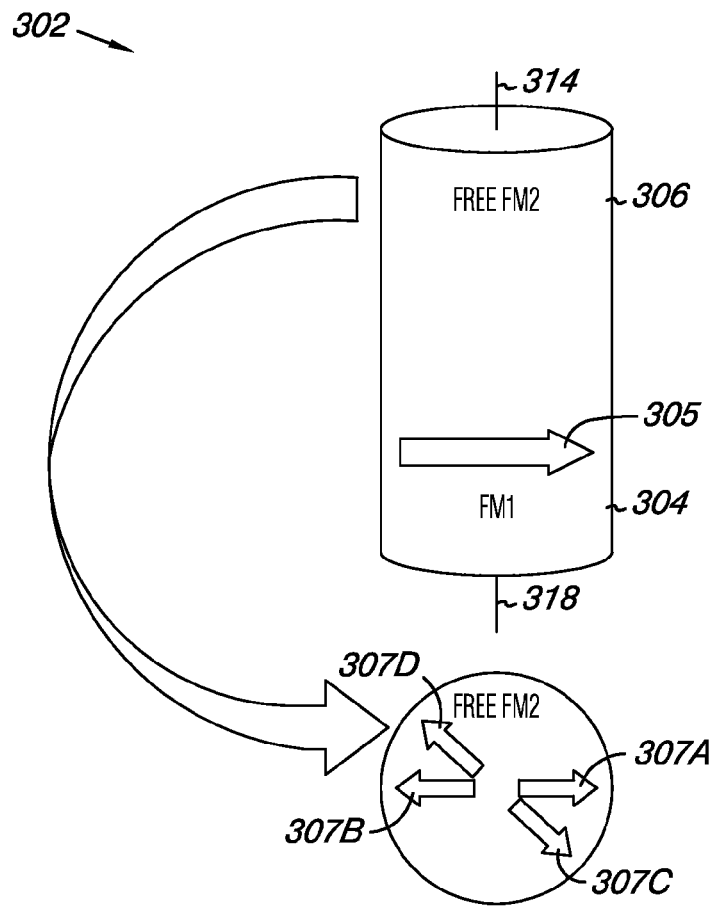
FIG. 3 illustrates an example single spin torque transfer (STT) magnetic random access memory (MRAM) structure having multiple resistance states that can be implemented as the memory element in FIG. 1 according to one or more embodiments of the present disclosure.

FIG. 3 illustrates an example single STT-MRAM structure having, for example, four resistance states that can be implemented as the memory element 102 in FIG. 1 according to one or more embodiments of the present disclosure. The single STT-MRAM structure 302 includes a pinned magnetic material portion 304 (e.g., pinned ferromagnetic material portion) and a free magnetic material portion 306 (e.g., free ferromagnetic material portion) separated by a tunnel barrier (not shown).

As described with respect to FIGS. 2A and 2B, current in a first direction (e.g., electrons flowing from the pinned magnetic portion 304 towards the free magnetic portion 306) and of a sufficient first magnitude, orients the magnetic moment of the free magnetic material portion 306 in a direction 307A parallel to the direction 305 of the magnetic moment of the pinned magnetic material portion 304. A first, lowest, resistance state results when the magnetic moments of the pinned 304 and free 306 layers are parallel to one another. Current in an opposite second direction (e.g., electrons flowing from the free magnetic portion 306 towards the pinned magnetic portion 304) and of a sufficient second magnitude, orients the magnetic moment of the free magnetic material portion 306 in a direction 307B anti-parallel to the direction 305 of the magnetic moment of the pinned magnetic material portion 304. A second, highest resistance state results when the magnetic moments of the pinned 304 and free 306 layers are anti-parallel to one another.

Additional resistance states may be obtained by orienting the magnetic moment of the free magnetic portion 306 to intermediate orientations with respect to the direction 305 of the magnetic moment of the pinned magnetic portion 304. For example, the magnetic moment of the free magnetic portion 306 may be oriented to one of a number of directions substantially parallel to 307C (e.g., substantially anti-parallel to 307D). In this manner, a third, relatively low, resistance state may be obtained (but having a resistance somewhat larger than the lowest resistance state obtained with parallel magnetic moment orientations) by passing current in the first direction, but for example at a magnitude less than the first magnitude and an appropriate time duration. A fourth, relatively high, resistance state may be obtained (but having a resistance somewhat smaller than the highest resistance state obtained with anti-parallel magnetic moment orientations) by passing current in the second direction, but at a magnitude less than the second magnitude and an appropriate time duration. While four discrete resistance states are illustrated in FIG. 3, embodiments of the present disclosure are not limited to this quantity of magnetic moment orientations, or their corresponding resistance states. More, fewer, or different orientations and resistance states are contemplated as being embodiments of the present disclosure.

Figure 4:
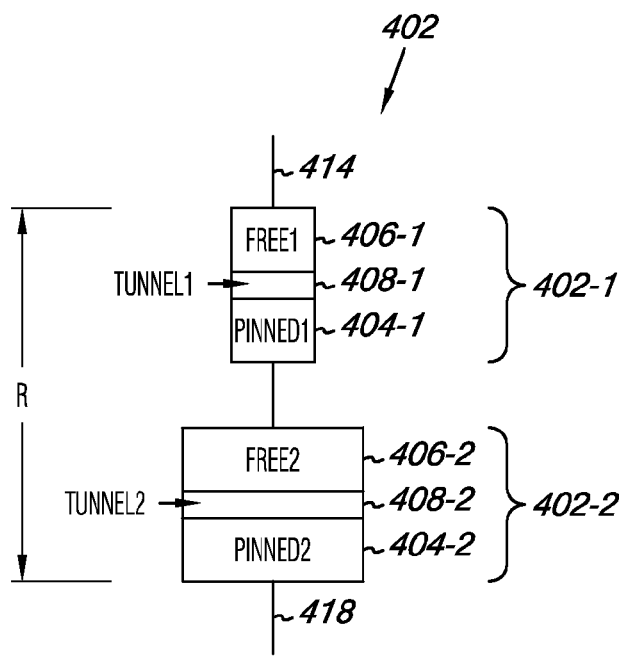
FIG. 4 illustrates an example stacked STT-MRAM structure having multiple resistance states that can be implemented as the memory element in FIG. 1 according to one or more embodiments of the present disclosure.

FIG. 4 illustrates an example stacked STT-MRAM structure having, for example, 4 resistance states that can be implemented as the memory element in FIG. 1 according to one or more embodiments of the present disclosure. One having ordinary skill in the art will appreciate that multiple resistance states may be achieved by coupling single stack magnetic structures, such as those described with respect to FIGS. 2A and 2B, in series and/or parallel combinations. FIG. 4 shows a first magnetic structure 402-1 and a second magnetic structure 402-2 connected in series. First magnetic structure 402-1 is drawn with a narrow profile to represent the magnetic moment of its free layer 406-1 being switched at a first current magnitude, and second magnetic structure 402-2 is drawn with a wide profile to represent the magnetic moment of its free layer 406-2 being switched at a second current magnitude. The overall resistance, R, of the series connected stacks is the sum of the resistances of the individual magnetic structures. Because the magnetic moments switch at different current magnitudes, four discrete values of total resistance, R, are possible (e.g., magnetic structure 402-1 low with magnetic structure 402-2 low; magnetic structure 402-1 low with magnetic structure 402-2 high; magnetic structure 402-1 high with magnetic structure 402-2 low; and magnetic structure 402-1 high with magnetic structure 402-2 high). Embodiments of the present disclosure are not limited to four resistance states as shown and described with respect to FIG. 4. One having ordinary skill in the art will appreciate that more or fewer states may be obtained by various combinations of magnetic structures, having various resistances and current operating levels.

Figure 5A:
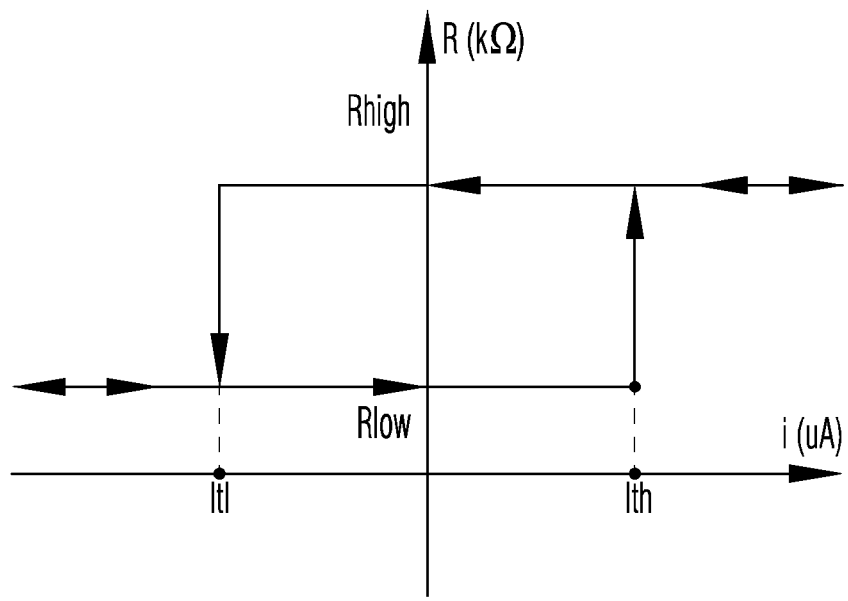
FIG. 5A illustrates a graph of resistance versus magnetizing current having two resistance states according to the magnetic structure embodiments of FIGS. 2A and 2B.

FIG. 5A illustrates a graph of resistance versus programming current, representing first and second stable resistance states (e.g., Rlow, Rhigh) corresponding to the two magnetic moment orientations shown in the magnetic structure embodiments illustrated in FIGS. 2A and 2B, respectively. One having ordinary skill in the art will appreciate the directional current and hysteresis current-resistance characteristics illustrated by the graph shown in FIG. 5A. Current magnitudes between threshold current levels Itl and Ith are insufficient to switch the magnetic moment of the free layer in either direction. Therefore, the magnetic structure remains in whatever magnetic orientation, and thus whatever resistance state, it is presently in.

As current magnitude in the positive direction increases beyond threshold current level Ith, the magnetic moment of the free layer orients anti-parallel to the magnetic moment of the pinned layer, resulting in the high resistance state (e.g., Rhigh). That is, if the magnetic moment of the free state were previously oriented parallel to the magnetic moment of the pinned layer, current through the magnetic structure in the positive direction having a magnitude greater than or equal to Ith would cause the magnetic moment of the free layer to switch orientation to an orientation anti-parallel to that of the pinned layer. If the magnetic moment of the free state were previously already oriented anti-parallel to the magnetic moment of the pinned layer, the free layer would remain in the anti-parallel orientation at all levels of current in the positive direction.

As current decreases, reverses direction, and magnitude in the negative direction increases beyond threshold current level Itl, the magnetic moment of the free layer orients parallel to the magnetic moment of the pinned layer, resulting in the low resistance state (e.g., Rlow). That is, if the magnetic moment of the free state were previously oriented anti-parallel to the magnetic moment of the pinned layer, current through the magnetic structure in the negative direction having a magnitude greater than or equal to Itl would cause the magnetic moment of the free layer to switch orientation to an orientation parallel to that of the pinned layer. If the magnetic moment of the free state were previously already oriented parallel (e.g., low resistance orientation) to the magnetic moment of the pinned layer, the free layer would remain in the parallel orientation at all levels of current in the positive direction.

Figure 5B:
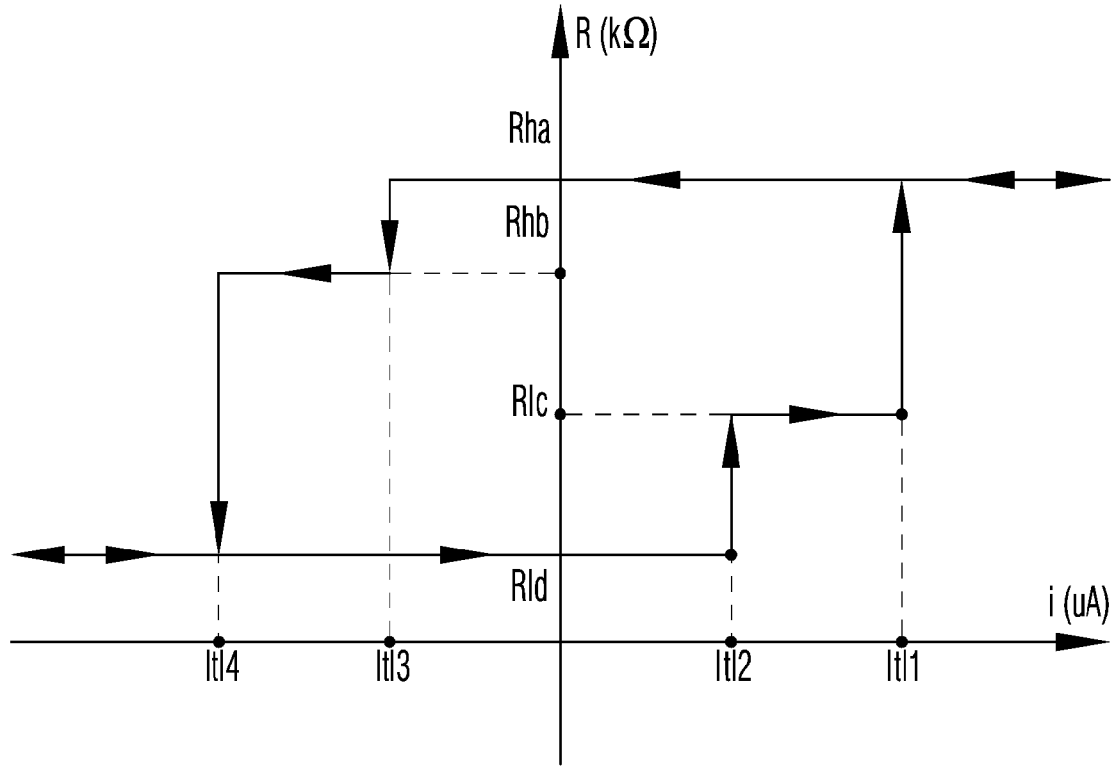
FIG. 5B illustrates a graph of resistance versus magnetizing current having four resistance states according to the magnetic structure embodiments of FIGS. 3 and 4.

FIG. 5B illustrates a graph of resistance versus programming current, representing four resistance states according to the magnetic structure embodiments of FIGS. 3 and 4. One skilled in the art will recognize that the four stable resistance states shown in FIG. 5B, from highest resistance to lowest resistance state, are Rha, Rhb, Rlc and Rld. The stable resistance states shown in FIG. 5B correspond, for example, to the four magnetic moment orientations shown in the magnetic structure embodiment illustrated in FIG. 3 (e.g., as indicated by the directional arrows corresponding to resistance states from highest to lowest: 307B, 307D, 307C, and 307A).

Current magnitudes between threshold current levels Itl2 and Itl3 are insufficient to switch the magnetic moment from their present orientation, and the memory cell remains in its existing resistance state, either the highest resistance state Rha or the lowest resistance state Rld respectively. Assuming a starting resistance state of Rld, as current magnitude in the positive direction increases beyond threshold current level Itl2, to below the threshold current level Itl, the memory cell resistance increases to Rlc. This increase in memory cell resistance occurs due to a change in orientation of the magnetic moment of the free portion 306 (e.g., from 307A to 307C) of the magnetic structure 302 shown in FIG. 3, or due to a switch in orientation of the magnetic moment of the free layer (e.g., 406-1) of one magnetic structure (e.g., 402-1), but not the other magnetic structure (e.g., 402-2).

As current magnitude further increases in the positive direction beyond threshold current level Itl1, the memory cell resistance increases to Rha, corresponding to the magnetic moment of the free portion 306, or the free layer 406-2 in the remaining magnetic structure (e.g., 402-2) being moved to an anti-parallel orientation (e.g., 307B). The resistance of the memory structure (e.g., 302 or 402) remains at the highest resistance state, Rha, until current direction reverses and equals or exceeds Itl3 in the reverse direction.

As the current magnitude increases in the negative direction beyond threshold current level Itl3, the memory cell resistance decreases to Rhb, corresponding to the magnetic moment of the free portion 306 being moved away from an anti-parallel orientation (e.g., from 307B to 307D). For the stacked memory structure embodiment 402 shown in FIG. 4, the decrease in memory cell resistance at threshold current level Itl3 corresponds to the magnetic moment of free layer 406-1 switching from an anti-parallel orientation to a parallel orientation, but the current not being sufficient to also switch the magnetic moment of free layer 406-2 away from an anti-parallel orientation. Thus the total resistance, R, of the memory structure 402 is the combination of magnetic structure 402-1 being in a low resistance state, and magnetic structure 402-2 remaining in a high resistance state.

As the current magnitude increases in the negative direction beyond threshold current level Itl4, the memory structure resistance decreases to its lowest level, Rld. This lowest resistance state corresponds to the free portion 306 of the single stack memory structure 302 shown in FIG. 3 being moved to a parallel orientation (e.g., from 307D to 307A). For the stacked structure embodiment 402 shown in FIG. 4, the decrease in memory cell resistance at threshold current level Itl4 in the negative direction corresponds to the magnetic moment of free layer 406-2 also switching from an anti-parallel orientation to a parallel orientation (e.g., both magnetic structures being in the parallel orientation). The resistance of the magnetic structure (e.g., 302 or 402) remains at the lowest resistance state, Rld, until the current direction reverses back to a positive direction and equals or exceeds Itl2, as described above.

Figure 6:
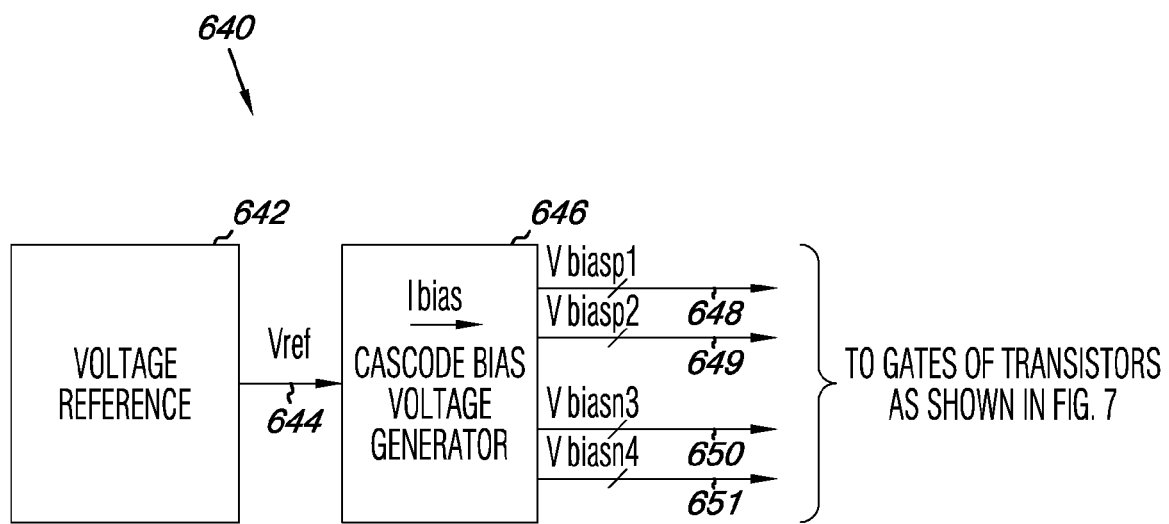
FIG. 6 is a functional block diagram of a bias voltage generation circuit associated with programming and sensing resistive memory in accordance with one or more embodiments of the present disclosure.

FIG. 6 is a functional block diagram of a bias voltage generation circuit associated with programming and sensing resistive memory in accordance with one or more embodiments of the present disclosure. The bias voltage generation circuit 640 includes a voltage reference 642, such as a bandgap or beta-multiplier, for generating a reference voltage signal 644, Vref. According to one or more embodiments, the reference voltage signal 644, Vref, is coupled as an input to a cascode bias voltage generator 646.

As the reader art will appreciate, the cascode bias voltage generator 646 generates a bias current, Ibias, and a number of bias voltages: Vbiasp1 (e.g., on signal line 648), Vbiasp2 (e.g., on signal line 649), Vbiasn3 (e.g., on signal line 650), and Vbiasn4 (e.g., on signal line 651). These bias voltages are analog signals selected to ensure respective transistor pairs are balanced and matching in current operation. According to one or more embodiments, Vbiasp1 has a larger magnitude than Vbiasp2, and Vbiasn3 has a larger magnitude than Vbiasn4. For example, Vbiasp1 can be 0.71V, Vbiasp2 can be 0.62V, Vbiasn3 can be 0.45V, and Vbiasn4 can be 0.31V. However, embodiments of the present disclosure are not so limited.

Figure 7:
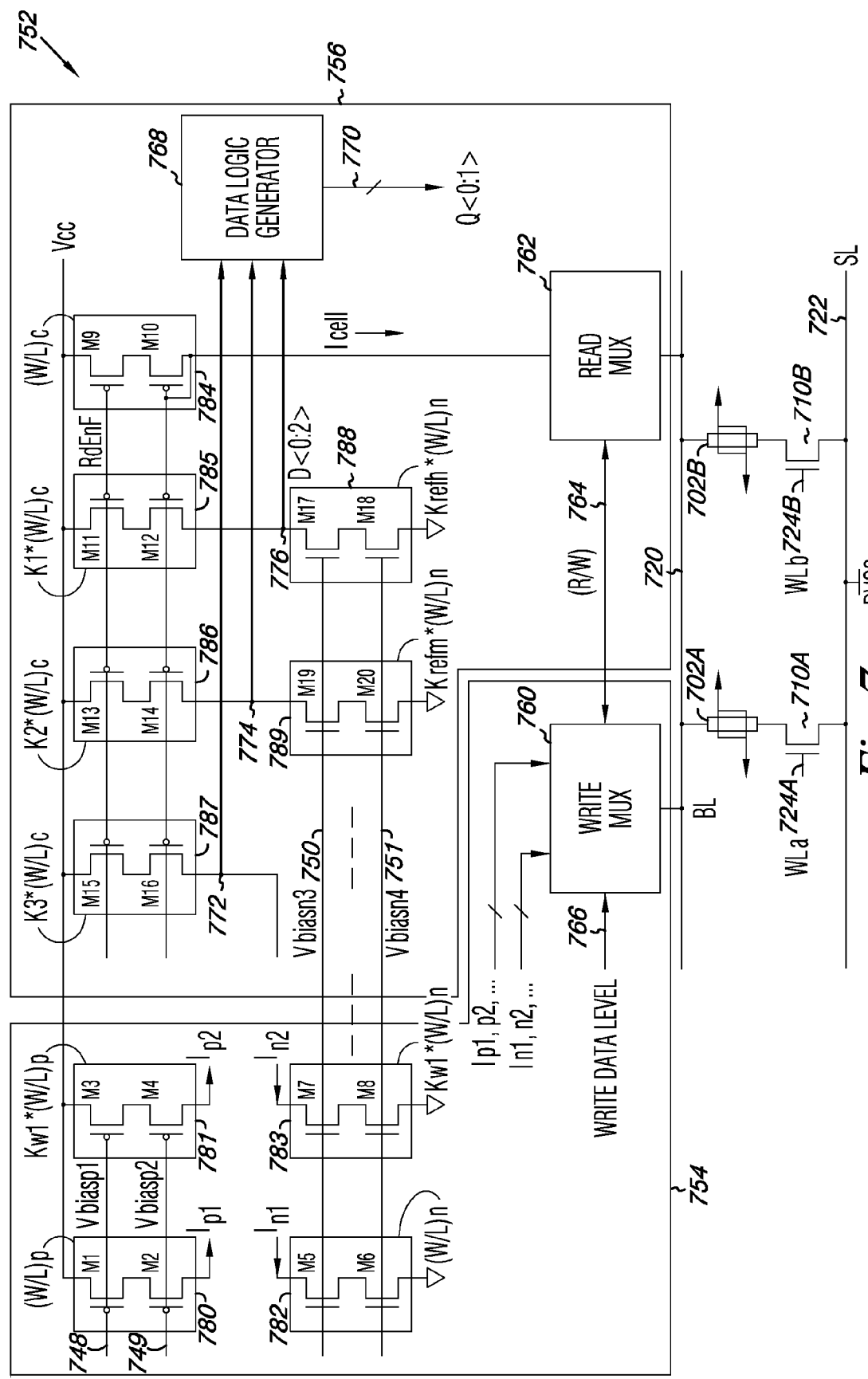
FIG. 7 is a schematic diagram of a resistive memory in accordance with one or more embodiments of the present disclosure.

Vbiasp1 can be used to control one transistor of each pMOS transistor pair providing programming currents of a number of magnitudes in a first direction to a resistive memory element (e.g., transistors M1 and M3 in FIG. 7). Vbiasp2 can be used to control the other transistor of each pMOS transistor pair (e.g., transistors M2 and M4 in FIG. 7). Vbiasn3 can be used to control one transistor of each nMOS transistor pair providing programming currents of a number of magnitudes in a second direction to a resistive memory element (e.g., current sink transistors M5 and M7 in FIG. 7). Vbiasn4 can be used to control the other transistor of each nMOS transistor pair (e.g., current sink transistors M6 and M8 in FIG. 7). Vbiasn3 and Vbiasn4 can also be used to respectively bias current sink transistors in a similar manner for mirror stages of a sensing circuit (e.g., M17-M20 as shown in FIG. 7).

FIG. 7 is a schematic diagram of a resistive memory in accordance with one or more embodiments of the present disclosure. The memory 752 illustrated in FIG. 7 operates to select an individual memory element of the resistive memory 752. The memory element has N resistance states, with N being an integer greater than one. Memory 752 further operates to select one of a programming current or a sensing current to pass through the memory element, the programming current being one of at least N different combinations of current direction and magnitude, and the sensing current being a reference current of a current mirror circuit.

The current mirror generates N−1 mirror currents, the mirror currents being proportional to the reference current. Each mirror current has a magnitude that corresponds to a resistance representing a boundary between respective resistance states of the resistive memory element. From the scaled mirror currents, the particular resistance state to which the memory element is programmed can be determined in parallel.

According to one or more embodiments, memory 752 includes a programming circuit 754, a sensing circuit 756, and at least one resistive memory element (e.g., 702A, 702B). The at least one resistive memory element (e.g., 702A, 702B) has N resistance states. Programming circuit 754 includes a switch (e.g., multiplexer) configured to select one of N programming currents for programming the at least one resistive memory elements (e.g., 702A, 702B). Sensing circuit 756 may be a cascode current mirror having a reference current stage providing a current proportional to a resistance of a selected resistive memory element, and N−1 mirror current stages arranged for parallel sensing of the N resistance states.

Memory 752 includes a first resistance memory element 702A coupled in series with a first access device 710A between a source line 722 and a bit line 720. A first word line 724A (e.g., WLa) is coupled to the gate of the first access device 710A. A second resistance memory element 702B is coupled in series with a second access device 710B also between the source line 722 and the bit line 720. A second word line 724B (e.g., WLb) is coupled to the gate of the second access device 710B. While only two memory elements are shown in FIG. 7, embodiments of the present disclosure are not limited to a particular quantity of memory elements arranged as described above.

Source line 722 is coupled to an intermediate potential (e.g., DVC2) of a voltage source. According to one or more embodiments, the intermediate potential DVC2 is switchably coupled to the source line 722, such that the source line may be isolated from the intermediate potential DVC2. The intermediate potential DVC2 is less positive (e.g., more negative) with respect to a voltage source positive terminal (e.g., Vcc), and more positive (e.g., less negative) with respect to a voltage source negative terminal (e.g., ground, voltage source reference).

A write level logic control switch (e.g., multiplexer) 760 (abbreviated as "Write Mux" in FIG. 7) receives a number of inputs, as will be described in further detail below. Write multiplexer 760 has an output coupled to the bit line 720. Write multiplexer 760 receives a "Write Data Level" control input 766, and this signal selects one or more of the number of inputs to pass through to the output of write multiplexer 760 (e.g., multiplexer 760 is configured to select one particular input, or a combination of several of the number of inputs).

A read enable control switch (e.g., multiplexer) 762 (abbreviated as "Read Mux" in FIG. 7) also has an output coupled to the bit line 720. The read mux 762 receives an input from a reference current stage of a mirror current circuit (e.g., a cascode current mirror circuit), as will be described in further detail below. A read/write ("R/W") control signal 764 between write mux 760 and read mux 762 controls whether the output from the write mux 760 or the read mux 762 will be selected to be connected to the bit line 720, depending on whether a programming operation, a sensing operation, or neither is selected. While FIG. 7 illustrates a separate write mux 760 and a separate read mux 762 with a control signal connection therebetween, one having ordinary skill in the art will appreciate that embodiments of the present disclosure are not limited to implementation of the functionality shown in FIG. 7, including selecting one of a programming input or a sensing input could be accomplished using other circuit configurations (e.g., a combined multiplexer having inputs from both of the programming 754 and sensing 756 circuits and an appropriate control signal).

According to one or more embodiments of the present disclosure, programming circuit 754 includes a source (e.g., positive and/or negative potentials derived from Vcc) switchably coupled to the write mux 760 so as to make a number of currents available for selection by the write mux 760. According to one or more embodiments of the present disclosure, the source is switchably coupled to the write mux 760 through at least one transistor (e.g., M1, M3, M5, M7). Current of one polarity (e.g., direction) may be provided through transistors coupled to a positive potential of the source and sunk to an intermediate potential of the source, and current of an opposite polarity (e.g., direction) may be provided from the intermediate potential of the source and sunk through transistors coupled to a negative potential of the source.

According to one or more embodiments of the present disclosure, programming circuit 754 includes pairs of series coupled transistors (e.g., M1 and M2, M3 and M4, M5 and M6, M7 and M8). As one having ordinary skill in the art will appreciate, transistor pairs where each transistor of a pair receives the same bias signal (e.g., similarly biased), may provide additional current limiting resistance and improve consistency of intended operating characteristics attributable to individual transistor manufacturing variations. While FIG. 7, and the discussion that follows, illustrates using pairs of similarly biased transistors, embodiments of the present disclosure are not so limited. One or more pairs of transistors shown in FIG. 7, may be implemented with fewer (e.g., one), or more, transistors, or with other type switching devices that may provide appropriate switching and current limiting characteristics consistent with the present disclosure.

The four pairs of series coupled transistors correspond to four stable resistance states in which the memory elements (e.g., 702A and 702B) may be programmed. Embodiments of the present disclosure are not limited to four pairs of transistors in the programming circuit 754, and may include more, or fewer, pairs depending on the desired number of resistance states to which the memory elements (e.g., 702A and 702B) may be programmed.

In the embodiment illustrated in FIG. 7, transistor pairs M1/M2 and M3/M4 are pMOS transistors coupled in series, source to drain. The gates of transistors M1 and M3 are coupled together, and the gates of transistors M2 and M4 are coupled together, as shown in FIG. 7. Transistor pairs M5/M6 and M7/M8 are nMOS transistors coupled in series, source to drain. The gates of transistors M5 and M7 are coupled together, and the gates of transistors M6 and M8 are coupled together, as shown in FIG. 7.

The pMOS transistor pair M1/M2 is further coupled between a first write/latch voltage source positive terminal (e.g., Vcc) and a first positive input to write mux 760 (e.g., Ip1). The pMOS transistor pair M3/M4 is further coupled between the write/latch voltage source positive terminal (e.g., Vcc) and a second input to write mux 760 (e.g., Ip2).

One having ordinary skill in the art will recognize that transistor channel dimensions (e.g., a combination of width and length) affect resistance through the transistor (and transistor pairs). Thus, one method for fabricating transistor pairs having different resistances, relative to one another, is to fabricate the transistors with different channel width and length combinations. Transistor resistance and channel dimensions are related as follows:

$$R=k*(L/W)*(1/(Vgs-Vth))$$

where R is resistance, L is channel length, W is channel width, k is a constant, Vgs is the gate-to-source voltage (assumes an nMOS type transistor, Vsg applicable for pMOS type transistors), and Vth is the threshold voltage.

As one having ordinary skill in the art will appreciate, transistor resistance (and transistor pair resistance) also determines the ability of the transistor (or transistor pair) to provide current from a given voltage source. Thus, transistor resistance may also be referred to as the transistor (or transistor pair) current driving strength. Transistor resistance (e.g., transistor current driving strength) is smaller as the ratio of the width divided by the length (W/L) increases. For a given set of nMOS transistor channel dimensions (e.g., W/L ratio), and in the saturation region, the current the transistor can drive (drain current, id) may be expressed as follows:

$$id=\text{constant}*(W/L)*(Vgs-Vth)^2.$$

According to one or more embodiments, the pMOS transistors M1 and M2 may, for example, each be fabricated to have similar channel dimensions (e.g., a given width and length, or having other related width and length dimensions), so that they each have a particular W/L ratio, and thus a particular resistance relative to other transistor pairs. Transistor pairs fabricated with similar channel dimensions are indicated in FIG. 7 as being grouped together within a given area (e.g., 780, 781, . . . 789). Each area is labeled with a relative resistance indication with respect to a given set of transistor pairs. For example, transistors M1 and M2, in area 780 are fabricated to have certain combination of channel dimensions to provide a corresponding resistance, as indicated by (W/L) p. Transistors M3 and M4 in area 781 are fabricated to have another certain combination of channel dimensions to provide a corresponding resistance, as indicated by Kw1*(W/L) p. The resistance of transistors M3 and M4 is proportional to the resistance of transistors M1 and M2 by a constant Kw1. The constant (e.g., Kw1) may be greater than, less than, or equal to one.

Similarly, transistors M5 and M6, in area 782 are fabricated to have certain combination of channel dimensions to provide a corresponding resistance, as indicated by (W/L)n. Transistors M7 and M8 in area 783 are fabricated to have another certain combination of channel dimensions to provide a corresponding resistance, as indicated by Kw1*(W/L)n. The resistance of transistors M1 and M2 in area 780, as indicated by (W/L)p, may, or may not be the same as the resistance of transistors M5 and M6 in area 782, as indicated by (W/L)n. The resistance of a transistor pair is expressed relative to the resistance of other transistor pairs shown in FIG. 7 with a similar relative resistance indication subscript.

Transistors M9 and M10, in area 784 are fabricated to have certain combination of channel dimensions to provide a corresponding resistance, as indicated by (W/L)c. Transistors M11 and M12 in area 785 are fabricated to have another certain combination of channel dimensions to provide a corresponding resistance, as indicated by K1*(W/L)c. Transistors M13 and M14 in area 786 are fabricated to have another certain combination of channel dimensions to provide a corresponding resistance, as indicated by K2*(W/L)c. Transistors M15 and M16 in area 787 are fabricated to have another certain combination of channel dimensions to provide a corresponding resistance, as indicated by K3*(W/L)c. The resistance of transistors M9 and M10 in area 784, as indicated by (W/L)c, may, or may not be the same as the resistance as transistors M1 and M2 in area 780 (as indicated by (W/L)p) and/or transistors M5 and M6 in area 782 (as indicated by (W/L)n).

Transistors M17 and M18, in area 788 are fabricated to have certain combination of channel dimensions to provide a corresponding resistance, as indicated by Krefh*(W/L)n. Transistors M19 and M20 in area 789 are fabricated to have another certain combination of channel dimensions to provide a corresponding resistance, as indicated by Krefm*(W/L)n. Thus the resistance of transistors M17 and M18 is shown in FIG. 7 as being relative to the resistance of transistors M19 and M20, the resistance being related by the ratio of the corresponding constants, Krefh and Krefm. The reader will appreciate that the relative resistance expressed for the above-mentioned transistor pairs, may be achieved by fabricating transistors that have channel dimensions (e.g., combination of channel width and length) that are also proportional relative to one another.

One having ordinary skill in the art will recognize that transistor pair M17 and M18 (having relative resistance Krefh*(W/L)n), and transistor pair M19 and M20 (having relative resistance Krefm*(W/L)n), not only have resistances (and channel dimensions) proportional to one another, but also to transistor pair M5 and M6 (having relative resistance (W/L)n) and transistor pair M7 and M8 (having relative resistance Kw1*(W/L)n). According to one or more embodiments of the present disclosure, Krefm and Krefh may be configured to be 1 and Kw1 respectively such that transistor pairs M5/M6 and M7/M8 may be appropriately used in place of, or in addition to, M17/M18 and M19/M20. For example, transistor pair M15 and M16 may be coupled to one of transistor pairs M5/M6 or M7/M8.

As further shown in FIG. 7, the nMOS transistor pair M5/M6 is further coupled between a first negative input to write mux 760 (e.g., In1) and a first write/latch voltage source negative terminal (e.g., a ground reference potential for Vcc). The nMOS transistor pair M7/M8 is further coupled between a second negative input to write mux 760 (e.g., In2) and the write/latch voltage source negative terminal One having ordinary skill in the art will appreciate that because the transistor pairs M1/M2 and M3/M4 are fabricated to different dimensions with respect to one another, each pair having a different W/L ratio and a different resistance corresponding to the different (W/L)p ratio, and therefore providing a different current magnitude from the same voltage potential (e.g., Vcc) through each transistor pair. For example, transistor pair M1/M2 drive a different current magnitude (but in the same direction) than transistor pair M3/M4. The currents will be different by the constant Kw1, corresponding to the transistor pairs having different dimension ratio values, and corresponding different resistances, all related by the constant Kw1.

Similarly, one having ordinary skill in the art will appreciate that because the transistor pairs M5/M6 and M7/M8 are fabricated to different dimensions with respect to one another, each pair having a different W/L ratio and a different resistance corresponding to the different (W/L)n ratio, and therefore providing a different current magnitude from the same voltage reference potential (e.g., ground) through each transistor pair to an intermediate voltage source potential. For example, transistor pair M5/M6 drive a different current magnitude (but in the same direction) than transistor pair M7/M8. The currents will be different by the constant Kw1, corresponding to the transistor pairs having different dimension ratio values, and corresponding different resistances, all related by the constant Kw1.

Of course, current will flow from the positive Vcc through transistor pairs coupled thereto and to the intermediate voltage source potential. Likewise current will flow from the intermediate voltage source potential to the transistor pairs coupled to the voltage source reference potential (e.g., ground). Thus, current will flow through transistor pairs M5/M6 and M7/M8 in an opposite direction than through transistor pairs M1/M2 and M3/M4, as indicated on FIG. 7 by the directional arrows shown for Ip1 and Ip2, in contrast with the directional arrows shown for In1 and In2.

Therefore, it should be apparent that by selecting a particular pair of transistors (e.g., M1/M2, M3/M4, M5/M6, M7/M8), currents of different direction and different magnitudes may be correspondingly selected. The several magnitudes in each direction may, or may not, be the same as the several current magnitudes available in the opposite direction, depending on the relationship of transistor channel dimensions between transistors having (W/L)p and (W/L)n ratios. For example, transistors M1/M2 and M5/M6 may be fabricated with appropriate channel dimensions such that (W/L)p equals (W/L)n, thereby providing pairs of currents in different directions but equal in magnitude. However, embodiments of the present disclosure are not so limited, and current magnitudes may all be different from one another for example.

According to one or more embodiments, the write mux 760 is configured to select an inputs from one of the number of transistor pairs corresponding to Ip1, Ip2, In1 and In2 (e.g., select an input from one of the number of transistor pairs: M1/M2, M3/M4, M5/M6, M7/M8). According to one or more embodiments, the write mux 760 can select a combination of currents (e.g., Ip1+Ip2, In1+In2, etc.), which the current value of the combination may also correspond to a programming current to achieve placing a memory element in a particular resistance state. For example, two smaller programming currents may be combined to produce a larger programming current. Similarly, two smaller sensing currents may be combined to produce a larger sensing current (e.g., mirror current). In this manner, through combinations of the transistor pairs, logic size may be reduced (since pairs of larger transistors, having lower resistance to drive higher currents, need not be provided in addition to the transistor pairs needed to drive the smaller magnitude currents). Furthermore, combining smaller magnitude currents to provide a larger magnitude current, by selecting pairs of transistors in parallel, may also help reduce mismatch of current since the same transistors are used for the larger currents, rather than new transistor pairs.

One having ordinary skill in the art will appreciate that the variety of different current magnitudes, in one or more directions, may also be provided by other circuit configurations. According to one or more embodiments, the transistor channel dimensions are held constant, but the magnitude of the voltage source to which a transistor pair is individually coupled may be different in order to drive different current magnitude. While FIG. 7 shows transistor pairs coupled to a common Vcc bus, the reader will appreciate that all transistor pairs need not be coupled to the same voltage source potential (as shown in FIG. 7), but rather each transistor pair may be individually coupled to a particular (e.g., unique) potential derived from the Vcc source.

As discussed above:

$$id = \text{constant} * (W/L) * (Vgs - Vth)^2.$$

Using a different source potential for different transistor pairs is equivalent to changing Vgs for nMOS transistors (or Vsg for pMOS transistors). This technique of selecting source potential pairs may be useful in non-linear programming or sensing applications, for example, and may achieve improved layout size than that of select transistor sizes in non-linear sensing schemes. One or more embodiments of the present disclosure may also be implemented using a combination of selecting source potential pairs and transistor channel dimension ratios (W/L).

To illustrate selecting source potential pairs, a first potential exists between a first write/latch voltage source positive terminal (e.g., having a magnitude corresponding to a value represented by "(W/L)p") and a first write/latch voltage source negative terminal (e.g., having a magnitude corresponding to a value represented by "(W/L)n"). A second potential may exist between a second write/latch voltage source positive terminal (e.g., having a magnitude corresponding to a value represented by "Kw1*(W/L)p") and a second write/latch voltage source negative terminal (e.g., having a magnitude corresponding to a value represented by "Kw1*(W/L)n"). According to one or more embodiments, these two potentials may be derived from the same voltage source. For example, one positive and negative terminal pair may represent the full potential of a voltage source, while the other positive and negative terminal pair may represent some portion of the full potential of the same voltage source. Alternatively, one positive and negative terminal pair may represent a pumped magnitude (e.g., from a charge pump) of the potential across the other positive and negative terminal pair.

The intermediate voltage source potential, DVC2, coupled to source line 722, is intermediate to the potential at each of the positive and negative terminal pairs (e.g., intermediate to a potential magnitude corresponding to a value represented by (W/L)p and a potential magnitude corresponding to a value represented by (W/L)n, and intermediate to a potential magnitude corresponding to a value represented by Kw1*(W/L)p and a potential magnitude corresponding to a value represented by Kw1*(W/L)n)) such that current could flow from each terminal more positive than DVC2 to DVC2, or from DVC2 to each terminal more negative than DVC2. The intermediate voltage source potential, DVC2, may be at a potential midway between the first potential difference (e.g., the potential between a potential magnitude corresponding to a value represented by (W/L)p and a potential magnitude corresponding to a value represented by (W/L)n), and/or at a potential midway between the second potential difference (e.g., the potential between a potential magnitude corresponding to a value represented by Kw1*(W/L)p and a potential magnitude corresponding to a value represented by Kw1*(W/L)n)); however, the intermediate voltage source potential, DVC2, need not be midway between either of the first or second potential differences.

For example, the intermediate voltage source potential, DVC2, may be at ⅓ of the potential between a potential magnitude corresponding to a value represented by (W/L)p and a potential magnitude corresponding to a value represented by (W/L)n, but ¼ of the potential between a potential magnitude corresponding to a value represented by Kw1*(W/L)p and a potential magnitude corresponding to a value represented by Kw1*(W/L)n. Or the intermediate voltage source potential, DVC2, may be at a potential that is exactly ½ way between the first potential difference and ½ way between the second potential difference. Each of the above-mentioned negative terminals may be at a reference (e.g., ground) potential, but need not be. For example, each potential may be tapped from a voltage source, or may be pumped up to, or reduced down to, the desired voltage.

The bias voltages generated (e.g., Vbiasp1, Vbiasp2, Vbiasn3, and Vbiasn4) bias the gates of the transistor pairs of the programming circuit 754, and sensing circuit 756, as previously discussed with respect to FIG. 6 and shown in FIG. 7. The Vbiasp1 signal line (e.g., 748 in FIG. 7 analogous to 648 in FIG. 6) is coupled to the gates of one transistor of each pMOS transistor pair of the programming circuit 754 providing programming currents of a number of magnitudes in a first direction (e.g., M1 and M3). The Vbiasp2 signal line (e.g., 749 in FIG. 7 analogous to 649 in FIG. 6) is coupled to the gates of the other transistor of each pMOS transistor pair in the programming circuit 754 (e.g., M2 and M4).

The Vbiasn3 signal line (e.g., 750 in FIG. 7 analogous to 650 in FIG. 6) is coupled to the gates of one transistor of each nMOS transistor pair of the programming circuit 754 providing programming currents of a number of magnitudes in a second direction (e.g., M5 and M7). The Vbiasn4 signal line (e.g., 751 in FIG. 7 analogous to 651 in FIG. 6) is coupled to the gates of the other transistor of each nMOS transistor pair in the programming circuit 754 (e.g., M6 and M8). FIG. 7 also shows Vbiasn3 coupled to the gates of one transistor of each current sinking nMOS transistor pair of the sensing circuit 756 (e.g., M17 and M19), and Vbiasn4 coupled to the gates of the other transistor of each current sinking nMOS transistor pair of the sensing circuit (e.g., M18 and M20).

As discussed with respect to FIG. 6, the Vbiasp1, Vbiasp2, Vbiasn3, and Vbiasn4 signals are appropriately generated analog signals for appropriately controlling the proper flow of the programming currents. In this manner, the Vbiasp1, Vbiasp2, Vbiasn3, and Vbiasn4 signals are used in generating each of the possible programming currents in parallel. One current direction and magnitude may then be selected, and supplied through write mux 760, to program a selected memory element (e.g., 702A, 702B) to a particular magnetic moment orientation, and thus to an associated resistance state.

One having ordinary skill in the art will appreciate that the write mux 760 may select one pair of transistors of the programming circuit 754 (e.g., M1 and M2, M3 and M4, M5 and M6, or M7 and M8), or a combination thereof as discussed above, to provide a desired current direction and magnitude. When either the M1/M2 or M3/M4 pair is selected, it should be apparent that current will flow from the respective voltage source terminal that is more positive than the intermediate voltage source potential, DVC2, through the transistor pair, through the write mux 760 to bit line 720 and through a memory element (e.g., 702A, 702B) and corresponding selected access device (e.g., 724A, 724B) to the source line 722, and finally sunk by the intermediate voltage source potential, DVC2. When either the M5/M6 or M7/M8 pair is selected, it should be apparent that current will flow from the intermediate voltage source potential, DVC2, through a selected access device (e.g., 724A, 724B) and corresponding memory element (e.g., 702A, 702B) to the bit line 720, through write mux 760 and the selected transistor pair, and sunk by the respective voltage source terminal that is more negative than the intermediate voltage source potential, DVC2. Thus, it should be understood that in this manner, two magnitudes of current (proportional to transistor channel dimension ration (W/L) and/or voltage source potentials differences), in each of two directions may be selected by the "Write Data Level" signal used to select a particular input to write mux 760.

According to one or more embodiments of the present disclosure, sensing circuit 756 includes pairs of series coupled transistors (e.g., M9 and M10, M11 and M12, M13 and M14, M15 and M16). In such embodiments, each of the transistors may be pMOS type, coupled together in series, source to drain. However, embodiments of the present disclosure are not limited to pMOS transistors, and the sensing circuit may be implemented using alternative components (e.g., pairs of nMOS transistors). Thus, one having ordinary skill in art will appreciate that one or more embodiments of the present disclosure may be implemented as shown in FIG. 7, with pMOS transistors in place of the nMOS transistors shown, and nMOS transistors in place of the pMOS transistors shown, with corresponding circuit changes in support thereof (e.g., appropriate read enable function signal, and connect the gate of M10 to function as a current mirror using an nMOS transistor, etc.).

The gates of transistors M9, M11, M13 and M15 are coupled together as shown in FIG. 7, and biased by the read enable function signal, "RdEnF" to enable operation of current mirror circuit, as is discussed further below. The gates of transistors M10, M12, M14 and M16 are coupled together as shown in FIG. 7, and are biased by the diode connection of transistors M10.

Each of the transistor pairs in the sensing circuit 756 (e.g., M9/M10, M11/M12, M13/M14, M15/M16) are coupled to the voltage source positive terminal (e.g., Vcc). The other end of transistor pair M9 and M10 is coupled to read mux 762 as the only input thereto. As the reader will appreciate, when read mux 762 is selected by R/W signal 764 (e.g., during a sense operation), a sensing current, I(cell) flows from the positive terminal of voltage source (e.g., Vcc), through transistor pair M9 and M10, through read mux 762, to the bit line 720 and through the memory element and selected access device to the source line 722, with the current being finally sunk to the intermediate voltage source potential, DVC2.

Transistor M10 is connected in a diode configuration, source to gate. Thus, one having ordinary skill in the art will recognize that the transistor pairs in the sensing circuit 756 (e.g., M9 and M10, M11 and M12, M13 and M14, M15 and M16) are configured as a cascode current mirror, with transistor pair M9 and M10 being the reference stage, and the other pairs being the mirror current stages. Each of the mirror current stages are coupled to the voltage source positive terminal (e.g., Vcc) and have a transistor pair resistance (e.g., transistor pair current driving strength) proportional to that of transistor pair M9/M10 by a respective constant (e.g., K1, K2, K3). Thus, if Icell flows through transistor pair M9 and M10, and through the selected memory element (e.g., 702A, 702B), then a respective proportionate (mirror) current will flow in each of the mirror current stages (e.g., K1*Icell through M11 and M12, K2*Icell through M13 and M14, K3*Icell through M15 and M16).

Each mirror current can be sunk through a pair of series connected (source to drain) nMOS transistors coupled to the respective mirror current stage. For example, the proportional mirror current flowing through pMOS transistor pair M11 and M12 (e.g., K1*Icell) is sunk through nMOS transistor pair M17 and M18 (having channel dimensions corresponding to Krefh*(W/L)n) to a voltage source reference potential (e.g., ground). The proportional mirror current flowing through pMOS transistor pair M13 and M14 (e.g., K2*Icell) is sunk to the voltage source reference potential (e.g., ground) through nMOS transistor pair M19 and M20 (having channel dimensions corresponding to Krefm*(W/L)n).

The proportional mirror current flowing through pMOS transistor pair M15 and M16 (e.g., K3*Icell) may be sunk through another nMOS transistor pair (not shown) to the voltage source reference potential through an nMOS transistor pair (not shown in FIG. 7, but having channel dimensions corresponding to Krefl*(W/L)n). The current sink circuit for transistor pair M15 and M16 is discussed further below. The gates M17 and M19 are coupled to the gates of M5 and M7, as shown in FIG. 7. The gates M18 and M20 are coupled to the gates of M6 and M8, as shown in FIG. 7. The gates of the nMOS current sink transistor pairs can be coupled to the Vbiasn signal 750 (corresponding to 650 in FIG. 6), and thereby controlled to turn on or off together.

In one or more embodiments, programming and sensing operations may not occur simultaneously. According to one or more embodiments of the present disclosure, rather than duplicating current sink transistor pairs for the current mirror current stages (e.g., M17 and M18, M19 and M20) in the memory 752, the sensing 756 and programming 754 circuits may be configured such that a mirror current stage of the sensing circuit 756 (e.g., M11 and M12, M13 and M14, M15 and M16) is coupled to a pair of nMOS transistors in the programming circuit 754 (e.g., M5 and M6, M7 and M8), which can be used to sink the respective mirror current. The gates of the nMOS current sink transistors of the programming circuit 754 (e.g., M5 and M6, M7 and M8) are biased by Vbiasn signal, and thus can be control similarly to M17-M20.

As the mirror currents flow in the mirror current stages (e.g., M11 and M12, M13 and M14, M15 and M16), voltages results at the nodes between the mirror current stages and the current sink nMOS transistor pairs (e.g., at nodes 772, 774, 776). Each of nodes 772, 774, and 776 are coupled as a input to data logic generator 768, as shown in FIG. 7.

According to one or more embodiments of the present disclosure, the magnitude of sensing current, Icell, flowing through transistor pair M9 and M10, through read mux 762 and the selected memory element depends on the resistance state of the memory element. If programmed to a higher resistance state, less sensing current will flow, and if programmed to a lower resistance state, more sensing current will flow, according to Ohm's law. Due to the current mirror configuration described above, and depending on the resistance state of the memory element, a corresponding amount of more, or less, current will also flow in each of the mirror current stages of the cascode current mirror. This occurs because M10 is diode connected, and the gates of one transistor in each current mirror stage (e.g., M12, M14 and M16) are coupled together so as to be similarly biased. As Icell changes (e.g., with memory element resistance), the bias voltage at the gates of M10, M12, M14 and M16 changes, thereby changing the channel resistance of the respective transistors, and in turn the current flowing in the respective mirror stage. Thus, the voltage at each of nodes 772, 774 and 776 will vary with the resistance state of the selected memory element being sensed, the voltage increasing as sensing current increases (which increases as memory element resistance decreases).

According to one or more embodiments of the present disclosure, and as previously discussed, a fixed value of Icell may be provided through transistor pair M9/M10, thereby causing a voltage across the resistance of the memory element being sensed, which can be measured and compared to a reference voltage. From the comparison, the resistance of the memory element being sensed may be determined.

The cascode current mirror includes three mirror current stages (e.g., three pairs of pMOS transistors) corresponding to the three boundary conditions between four possible logic states to which a memory cell may be programmed. Thus, the three node voltages are received by the data logic generator and compared to reference levels to determine by the node voltages, which correspond to the sensing current, the resistance state of a selected memory cell. In this manner, the data logic generator 768 can determine the resistance state being sensed, and generate an output 770.

Embodiments of the present disclosure are not limited to memory having memory cells with four resistance states. The memory circuits described with reference to FIG. 7 are scalable by adding, for example, one pair of pMOS (source) transistors and one pair of nMOS (sink) transistors to the programming circuit 754 for every two extra bi-directional write levels available in the memory pair magnitudes (e.g., through constants such as Kw1).

The multi-level parallel sensing circuit 756 is also scalable by adding, for example, a pair of pMOS transistors as an additional mirror current stage of the current mirror configuration (and associated pair of nMOS transistors to sink the mirror current if necessary). Sensing reference levels may be adjusted, even dynamically to accommodate operational changes, by adjustment of voltage supply to and/or constants (e.g., K1, K2, K3 and/or Krefh, Krefm, Krefl) of the mirror current stages.

Sensing levels may be set to accommodate a linear distribution of resistance states, or a non-linear distribution of resistance states, such as by adjustment of the ratios between mirror current stage constants (e.g., K1, K2, K3). Linearly distributed resistance states may be sensed using equal intervals between K1, K2, and K3. Non-linear distributed resistance states may be sensed when some or all of the intervals between K1, K2, K3, etc. are different (corresponding to the non-linear distribution of the resistance states).

Sensing margins, sensitivity, speed, and timing may be adjusted through selection of appropriate ratios K1, K2, K3, Krefh, Krefm, and Krefl. These constants may even be dynamically changed during operation of the circuit (e.g., to accommodate a particular linearity of resistance states).

As one having ordinary skill in the art will appreciate, the resistance of the transistors in the stages of a current mirror circuit dynamically change, eventually reaching a stable operating point in order to maintain current drive defined by external circuit factors (e.g., resistance of the read mux and memory element, source potential magnitude, etc.) and the scale factor of transistor channel dimensions (e.g., determined by ratio of channel width to length). Once the current drive through the mirror circuit stages becomes stable, the individual transistor resistances maintain a stable value.

In order to illustrate the present disclosure in more detail, the following discussion provides some example component and operating values. However, embodiments of the present disclosure are not limited to the example component and operating values disclosed.

According to one or more embodiments, Vcc may be selected to have a magnitude of 1.2 volts. Resistive memory elements may be programmed to 4 resistance states (e.g., 1000 ohm, 3000 ohm, 5000 ohm and 7000 ohm). We may define the desired programming boundary currents to be: Ip1=+50 microamps, In1=−50 microamps (e.g., 50 microamps in a direction opposite to Ip1), Ip2=+100 microamps, and In2=−100 microamps (e.g., 100 microamps in a direction opposite to Ip2).

The sensing current magnitude should be smaller than the smallest programming current in order to avoid a sensing current from changing the resistance state of a memory element. Icell (e.g., through M9 and M10) may be, for example: 31 microamps through a memory element programmed to a 7000 ohm resistance state, 35 microamps through a memory element programmed to a 5000 ohm resistance state, 40 microamps through a memory element programmed to a 3000 ohm resistance state, and 46 microamps through a memory element programmed to a 1000 ohm resistance state. Thus, the reference current magnitudes between the expected Icell for each of the respective resistance states may be: Irefh (through M11 and M12)=43 microamps, Irefm (through M13 and M14)=37.5 microamps, and Irefl (through M15 and M16) =33 microamps.

By further setting K1, K2, K3, Krefh, Krefm, and Krefl (Krefl not shown in FIG. 7, but could be implemented, for example, as a pair of transistors to sink current from M15 and M16) factors appropriately (e.g., separately), sensing margins may be increased by multiples (e.g., ×2, ×3). K1, K2 and K3 may be set by appropriately sizing channel width and length for each pair of pMOS transistors (e.g., M11 and M12 for K1, M13 and M14 for K2, M15 and M16 for K3) relative to the channel width and length of M9 and M10. Similarly, Krefh, Krefm, and Krefl may be set by appropriately sizing channel width and length for each pair of nMOS transistors (e.g., M17 and M18 for Krefh, M19 and M20 for Krefm, etc.) relative to the channel width and length of M5 and M6 (shown in FIG. 7 as being the reference pair of current sink transistors by the relative channel dimension ratio of (W/L)n).

For example, by appropriately fabricating, M15, M16, and corresponding current sink (not shown in FIG. 7) transistor channel dimensions to set K3=Krefl=2, the worst case lower margin increases from 2 microamps (e.g., between Irefl and Icell for a 7000 ohm resistance, and between Irefl and Icell for a 5000 ohm resistance) to 2 microamps times 2 equals 4 microamps. As one having ordinary skill in the art will appreciate, this occurs because the mirror current in a particular stage are amplified according to the values of the corresponding transistor dimension constants. Similarly, by appropriately fabricating M13, M14, M19 and M20 transistor channel dimensions to set K2=Krefm=2, the worst case middle margin increases from 2.5 microamps (e.g., between Irefm and Icell for a 5000 ohm resistance, and between Irefm and Icell for a 3000 ohm resistance) to 2.5 microamps times 2 equals 5 microamps. Likewise, by appropriately fabricating M11, M12, M17 and M18 transistor channel dimensions to set K1=Krefh=2, the worst case high margin increases from 3 microamps (e.g., between Irefh and Icell for a 3000 ohm resistance, and between Irefh and Icell for a 1000 ohm resistance) to 3 microamps times 2 equals 6 microamps.

Although several of the constants were selected in the example provided above to have the same value, embodiments of the present disclosure are not so limited, and constants may, or may not, be the same or different from one another. For example, transistors M15 and M16 may be appropriately fabricated (or selected) such that K3=5. Margins may also be adjusted by changing the M9 and M10 dimensions, so as to change Ibias for particular memory element resistance values according to the following relationship:

a. $Kref(h/m/l) = Iref(h/m/l) * Ki/Ibias$ (where I=1,2,3)

Where Iref(h/m/l) represents the current flowing through transistors fabricated to have channel width/length dimensions Kref(h/m/l) times the channel width/length dimensions of a reference set of transistors (e.g., M5 and M6 in FIG. 7). Ibias is current generated by the cascode bias voltage generator (e.g., 646 in FIG. 6), which is equivalent to In1 flowing through the reference set of transistors (e.g., M5 and M6 in FIG. 7).

The example values given above are for illustration of only certain features of the present disclosure. The reader will appreciate that embodiments of the present disclosure can be implemented to obtain current values, and relative transistor dimensions (and thus, the values of the various constants) appropriate to the particular resistive states of the associated resistive memory elements, and consistent with the equation set forth above. Circuit design choices may be made to achieve various operating characteristics, including sensing time, circuit foot print, and power consumption.

Although a parallel sensing technique is shown in FIG. 7 and described above, embodiments of the present disclosure are not so limited, and thus may include serial binary sensing techniques and circuit configurations, which may provide for power and circuit layout size reductions in some applications. That is, rather than generating mirror currents in parallel, the number of sensing currents could be generated one after another, serially over some time period. Such an approach may reduce circuit complexity and footprint; however, it may do so at the expense of additional time to accomplish the sensing serially. The scaling factor (e.g., using the above-mentioned constants) is applicable to serial binary sensing schemes as well.

Embodiments of the present disclosure are not limited to strictly parallel, or strictly serial, sensing techniques. According to one or more embodiments of the present disclosure, a resistive memory may include a hybrid sensing circuit, implementing a combination of both serial and parallel sensing techniques (e.g., a binary sensing operation and a parallel sensing operation). Hybrid sensing is a compromise between the speed advantages of parallel sensing, and the power and/or circuit space saving advantages of serial sensing, and may be particularly well suited for use with resistive memory element having multiple resistance states (e.g., four or greater). For example, a hybrid sensing technique may first implement a binary sensing operation to determine whether the resistance state of a resistive memory element is of greater resistance or lesser resistance than a particular initial resistance value (e.g., binary sensing). Subsequently, parallel sensing may be used to simultaneously determine the resistance state of the resistive memory element from among several resistance states of greater resistance than the particular initial resistance value, or to determine from among several resistance states of lesser resistance than the particular initial resistance value.

Figure 8:
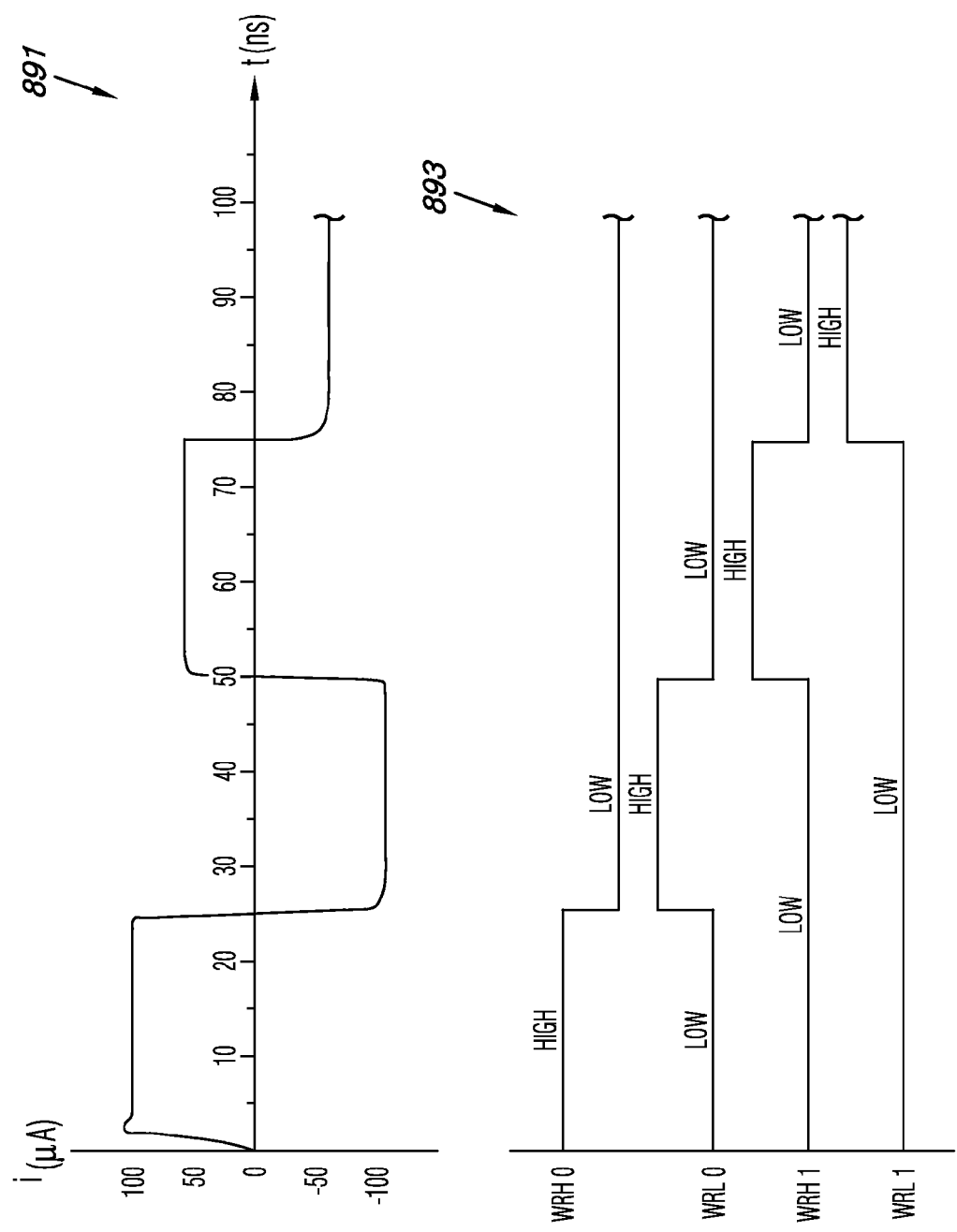
FIG. 8 shows timing waveforms associated with operating resistive memory cells in accordance with one or more embodiments of the present disclosure.

FIG. 8 shows timing waveforms associated with operating resistive memory cells in accordance with one or more embodiments of the present disclosure. The programming current versus time waveform 891 shows programming current direction and magnitude changes occurring at 25 nS intervals. Initially, the programming current is stepped to 100 micro amps in the positive direction, switched at 25 nS to 100 micro amps in the negative direction, switched at 50 nS to 52 micro amps in the positive direction, and finally switched at 75 nS to 60 micro amps in the negative direction.

Logic level traces 893 are shown for each of four logic states, corresponding to the four resistance states of a resistive memory structure (e.g., 302 in FIG. 3), and corresponding to the programming current versus time waveform 891 shown above. As discussed in general with respect to the resistance versus programming current hysteresis graph shown in FIG. 5B, a large magnitude programming current (e.g., 100 micro amps) in the positive direction is selected by WRH0 (indicating the memory cell being in the highest resistance state) to go HIGH. Thereafter, switching programming current to a large magnitude current (e.g., 100 micro amps) in the negative direction is selected by signal WRH0 (indicating the memory cell being in the highest resistance state) to go LOW, and signal WRL0 (indicating the memory cell being in the lowest resistance state) to switch from a LOW to HIGH logic level.

As the programming current is switched again at 50 nS to an intermediate magnitude (e.g., 52 micro amps) in the positive direction, signal WRL0 (indicating the memory cell being in the lowest resistance state) goes LOW, while signal WRH1 (indicating the memory cell being in the higher of the two intermediate resistance states) switches from LOW to HIGH. Finally, as the programming current is switched at 75 nS to an intermediate magnitude (e.g., 60 micro amps) in the negative direction, signal WRH1 (indicating the memory cell being in the higher of the two intermediate resistance states) goes LOW, and signal WRL1 (indicating the memory cell being in the lower of the two intermediate resistance states) switches from LOW to HIGH.

Figure 9:
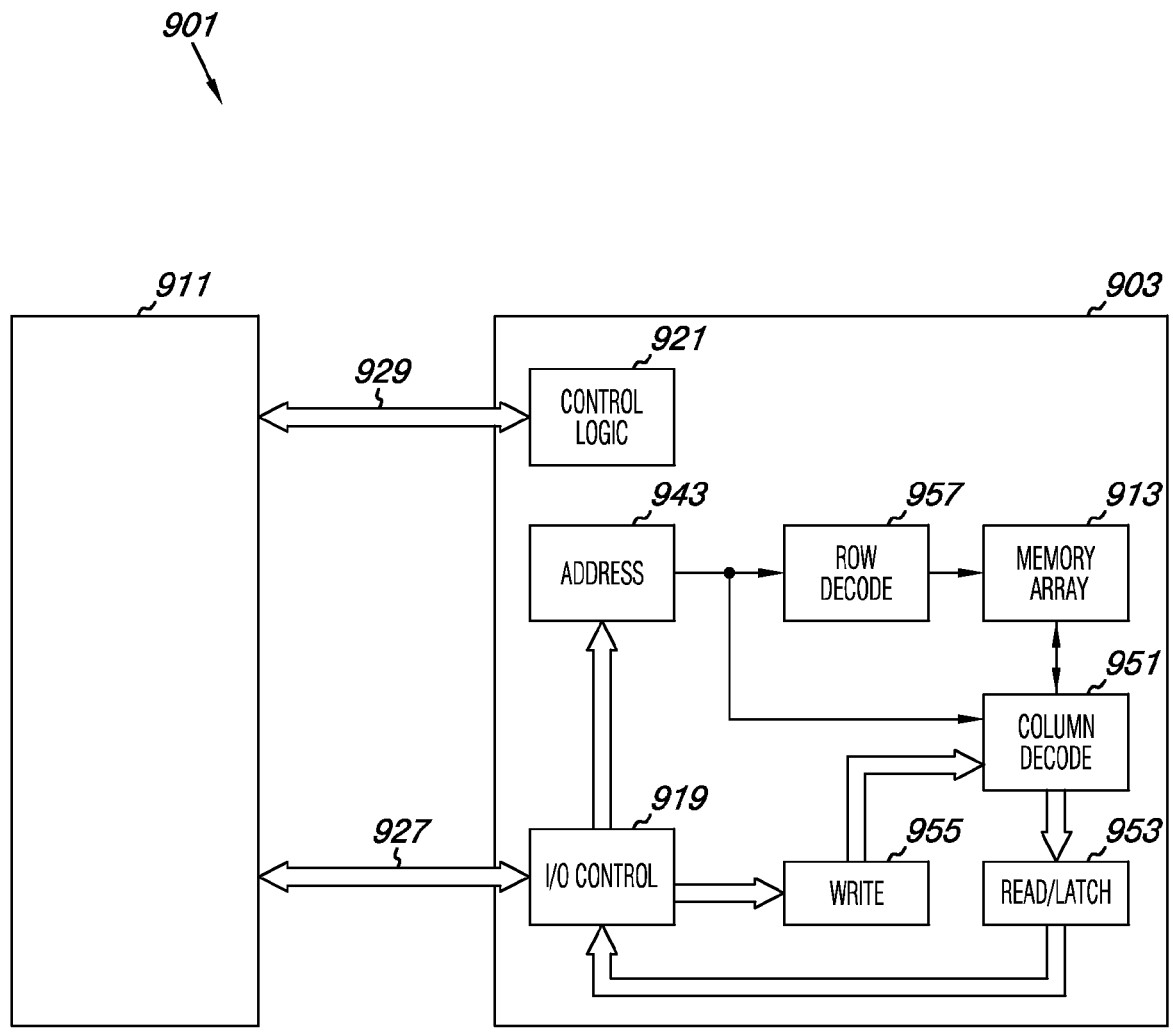
FIG. 9 is a functional block diagram of an electronic system having at least one resistive memory device in accordance with one or more embodiments of the present disclosure.

FIG. 9 is a functional block diagram of an electronic system (e.g., memory system) having at least one resistive memory device in accordance with one or more embodiments of the present disclosure. Memory system 901 includes a memory access device 911 (e.g., processor, memory controller, etc.) coupled to the memory device 903. According to one or more embodiments of the present disclosure, the memory device 903 is a non-volatile resistive memory device such an MRAM device.

The non-volatile memory device 903 includes a memory array 913 of non-volatile memory cells. The non-volatile memory device 903 and memory access device 911, can be implemented as separate integrated circuits, or the memory access device 911 and the memory device 903 can be incorporated into the same integrated circuit, chip, or package. The memory access device 911 can be a discrete device (e.g., microprocessor) or some other type of process circuitry implemented in firmware, such as an application-specific integrated circuit (ASIC).

I/O connections 927 and control connections 929 include a communication interface between the processor 911 and the memory device 903. The embodiment of FIG. 9 includes address circuitry 943 to latch address signals provided over the I/O connections 927 through I/O control circuitry 919. Address signals are received and decoded by a row decoder 957 and a column decoder 950 to access the memory array 913. In light of the present disclosure, it will be appreciated by those having ordinary skill in the art that the number of address input connections depends on the density and architecture of the memory array 913 and that the number of addresses increases with both increased numbers of memory cells per memory array, an increased number of memory blocks, and/or an increased number of memory arrays. The reader will also appreciate that more address information may be needed to specify a particular portion of the memory array as the size of the memory array increases.

The memory device 903 senses data in the memory array 913 by sensing voltage and/or current changes in the memory array columns using sense/buffer circuitry, shown in FIG. 9 as the read/latch circuitry 953. The read/latch circuitry 953 can read and latch a page (e.g., a row) of data from the memory array 913. I/O control circuitry 919 is included for bi-directional data communication over the I/O connections 927 with the memory access device 911. Write circuitry 955 is included to write data to the memory array 913.

Control logic circuitry 921 decodes signals provided by control connections 929 from the memory access device 911. These signals can include chip signals, write enable signals, and address latch signals (among others) that are used to control the operations on the memory device 903, and of the memory array 913, including data sensing (e.g., reading) data programming (e.g., writing, erasing).

The control logic circuitry 921 can send signals (e.g., commands) to selectively set particular registers and/or sections of registers, or latch data in one or more registers. In one or more embodiments, the control logic circuitry 921 is responsible for executing instructions received from the memory access device 911 to perform certain operations on some portion of the memory cells of the memory array 913. The control logic circuitry 921 can be a state machine, a sequencer, or some other type of logic controller. It will be appreciated by those having ordinary skill in the art that additional circuitry and control signals can be provided, and that the memory device detail of FIG. 9 has been reduced to facilitate ease of illustration.

CONCLUSION

The present disclosure includes resistive memory devices and systems having resistive memory cells, as well as methods for operating the resistive memory cells. One resistive memory embodiment includes at least one resistive memory element, a programming circuit, and a sensing circuit. For example, the programming circuit can include a switch configured to select one of N programming currents for programming the at least one resistive memory element, where each of the N programming currents has a unique combination of current direction and magnitude, with N corresponding to the number of resistance states of the at least one memory element. In one or more embodiments, the sensing circuit can be a cascode current mirror sensing circuit having a reference current stage providing a current proportional to a resistance of a selected memory element, and N−1 mirror current stages arranged for parallel sensing for the N resistance.

In the detailed description of the present disclosure, reference is made to the accompanying drawings that form a part hereof, and in which is shown by way of illustration how one or more embodiments of the present disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the extent of the present disclosure.

As used herein, the designators "N" and "M," particularly with respect to reference numerals in the drawings, indicate that a number of the particular feature so designated can be included with one or more embodiments of the present disclosure. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

It will be understood that when an element or layer is referred to as being "on," "connected to" or "coupled with" another element or layer, it can be directly on, connected, or coupled with the other element or layer or intervening elements or layers may be present. In contrast, when an element is referred to as being "directly on," "directly connected to" or "directly coupled with" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, wiring lines, layers, and/or sections should not be limited by these terms. These terms are only used to distinguish one element, component, region, wiring line, layer, or section from another region, layer, or section. Thus, a first element, component, region, wiring line, layer or section discussed below could be termed a second element, component, region, wiring line, layer, or section without departing from the teachings of the present disclosure.

Spatially relative terms, such as "beneath," "below," "lower," "above," "upper," and the like, may be used herein for ease of description to describe one element or feature's relationship to another element(s) or feature(s) as illustrated in the figures rather than an absolute orientation in space. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

Embodiments of the present disclosure are described herein with reference to functional block illustrations that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes and relative sizes, thicknesses, and so forth, are not intended to illustrate the precise shape/size/thickness of a region and are not intended to limit the scope of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising
   at least one resistive memory element;
   a programming circuit including a switch configured to select one of N programming currents for programming the at least one resistive memory element, where each of the N programming currents has a unique combination of current direction and magnitude, with N corresponding to the number of resistance states of the at least one memory element; and
   a sensing circuit arranged for sensing of the N resistance states.

2. The memory device of claim 1, wherein the sensing circuit is a current mirror sensing circuit having a reference current stage providing a current proportional to a resistance of a selected resistive memory element, and N−1 mirror current stages arranged for parallel sensing of the N resistance states.

3. The memory device of claim 1, wherein the sensing circuit is a serial binary sensing circuit providing a number of sensing currents over time.

4. The memory device of claim 1, wherein the programming currents are multi-level, bi-directional.

5. The memory device of claim 1, wherein the at least one memory element is coupled between the switch and an intermediate potential.

6. The memory device of claim 5, wherein the switch is configured to:
   route programming current of a first direction from a potential more positive than the intermediate potential, through at least one memory element, to the intermediate potential; and
   route programming current of a second direction from the intermediate potential, through at least one memory element to a potential more negative than the intermediate potential.

7. The memory device of claim 6, wherein the programming circuit includes:
   at least one pMOS transistor coupled between the potential more positive than the intermediate potential and the switch, each pMOS transistor having a unique ratio of channel width divided by channel length;
   at least one nMOS transistor coupled between the potential more negative than the intermediate potential and the switch, each nMOS transistor having a unique ratio of channel width divided by channel length; and
   wherein the gates of the at least one pMOS transistor are similarly biased, and the gates of the at least one nMOS transistor are similarly biased.

8. The memory device of claim 6, wherein the programming circuit includes:
   pairs of series-connected pMOS transistor coupled between the potential more positive than the intermediate potential and the switch, each pair of pMOS transistors having a unique ratio of channel width divided by channel length;
   pairs of series-connected nMOS transistors coupled between the potential more negative than the intermediate potential and the switch, each pair of nMOS transistors having a unique ratio of channel width divided by channel length; and
   wherein the gate of a respective transistor of one pair of the pairs of pMOS transistors is biased to a gate of a corresponding respective transistor of another pair of the pairs of pMOS transistors, and the gate of a respective transistor of one pair of the pairs of nMOS transistors is biased to a gate of a corresponding respective transistor of another pair of the pairs of nMOS transistors.

9. The memory device of claim 6, wherein the programming circuit includes:
   at least one nMOS transistor coupled between the potential more positive than the intermediate potential and the switch, each nMOS transistor having a unique ratio of channel width divided by channel length;
   at least one pMOS transistor coupled between the potential more negative than the intermediate potential and the switch, each pMOS transistor having a unique ratio of channel width divided by channel length; and
   wherein the gates of the at least one pMOS transistors are similarly biased, and the gates of the at least one nMOS transistors are similarly biased.

10. The memory device of claim 6, wherein the programming circuit includes:
    pairs of series-connected nMOS transistors coupled between the potential more positive than the intermediate potential and the switch, each pair of nMOS transistors having a unique ratio of channel width divided by channel length;
    pairs of series-connected pMOS transistors coupled between the potential more negative than the intermediate potential and the switch, each pair of pMOS transistors having a unique ratio of channel width divided by channel length; and
    wherein the gate of a respective transistor of one pair of the pairs of pMOS transistors is biased to a gate of a corresponding respective transistor of another pair of the pairs of pMOS transistors, and the gate of a respective transistor of one pair of the pairs of nMOS transistors is biased to a gate of a corresponding respective transistor of another pair of the pairs of nMOS transistors.

11. The memory device of claim 6, wherein the programming circuit includes:
    pairs of series-connected pMOS transistors that, during operation of the programming circuit, are coupled between at least one potential more positive than the intermediate potential and the switch;

pairs of series-connected nMOS transistors that, during operation of the programming circuit, are coupled between at least one potential more negative than the intermediate potential and the switch; and wherein the gate of a respective transistor of one pair of the pairs of pMOS transistors is biased to a gate of a corresponding respective transistor of another pair of the pairs of pMOS transistors, and the gate of a respective transistor of one pair of the pairs of nMOS transistors is biased to a gate of a corresponding respective transistor of another pair of the pairs of nMOS transistors.

12. The memory device of claim 6, wherein the programming circuit includes:

pairs of series-connected nMOS transistors that, during operation of the programming circuit, are coupled between at least one potential more positive than the intermediate potential and the switch;

pairs of series-connected pMOS transistors that, during operation of the programming circuit, are coupled between at least one potential more negative than the intermediate potential and the switch; and wherein the gate of a respective transistor of one pair of the pairs of pMOS transistors is biased to a gate of a corresponding respective transistor of another pair of the pairs of pMOS transistors, and the gate of a respective transistor of one pair of the pairs of nMOS transistors is biased to a gate of a corresponding respective transistor of another pair of the pairs of nMOS transistors.

13. The memory device of claim 5, wherein the switch is configured to:

route programming currents selected to flow from a potential more positive than the intermediate potential through one of N/2 transistor pairs having a unique ratio of channel width divided by channel length among the N/2 transistor pairs, through at least one memory element to the intermediate potential; and route programming currents selected to flow from the intermediate potential through at least one memory element, through one of another N/2 transistor pairs having a unique ratio of channel width divided by channel length among the another N/2 transistor pairs to a potential more negative than the intermediate potential, wherein the magnitudes of the programming currents from each of the N/2 transistor pairs are different from one another, and the magnitudes of the programming currents from each of the another N/2 transistor pairs are different from one another.

14. The memory device of claim 5, wherein the switch is configured to:

route programming currents selected to flow from one of N/2 potentials more positive than the intermediate potential, through at least one memory element, to the intermediate potential; and route programming currents selected to flow from the intermediate potential through at least one memory element to one of N/2 potentials more negative than the intermediate potential, wherein the magnitudes of the programming currents from each of the N/2 more positive potentials are different from one another, and the magnitudes of the programming currents to each of the N/2 more negative potentials are different from one another.

15. The memory device of claim 2, wherein the current mirror sensing circuit is configured such that mirror currents of the mirror current stages are different from one another and proportional to the current of the reference current stage.

16. The memory device of claim 15, wherein each of the mirror current stages has a respective resistance representing a respective boundary between respective adjacent ones of the resistance states of the resistive memory element.

17. The memory device of claim 16, wherein the resistances of the mirror current stages are linearly related based on a linear distribution of the resistance states.

18. The memory device of claim 16, wherein the resistances of the mirror current stages are non-linearly related based on a non-linear distribution of the resistance states.

19. The memory device of claim 1, wherein the sensing circuit is arranged for sensing of the N resistance states using a hybrid sensing technique including a binary sensing operation and a parallel sensing operation.

20. A memory device, comprising at least one memory cell coupled to an intermediate potential during operation of the memory cell including a resistive memory element and an access device;

a programming circuit, including:

a write switch having an output and a plurality of selectable inputs, the at least one memory cell coupled between the write switch output and the intermediate potential during operation of the programming circuit;

one or more pairs of first transistors coupled between at least a first potential during operation of the programming circuit and at least one of the plurality of selectable write switch inputs;

one or more pairs of second transistors coupled between at least a second potential during operation of the programming circuit and at least one of the plurality of selectable write switch inputs; and a sensing circuit, including:

a cascode current mirror circuit having a reference current stage and at least one mirror current stage, the reference current stage being selectively coupled through a read switch to the at least one memory cell.

21. The memory device of claim 20, wherein the at least one memory cell is switchably coupled to the intermediate potential.

22. The memory device of claim 20, wherein:

each of the one or more pairs of first transistors has a unique ratio of channel width divided by channel length so as to provide a unique current with respect to the at least one first potential; and each of the one or more pairs of second transistors has a unique ratio of channel width divided by channel length so as to provide a unique current with respect to the at least one second potential.

23. The memory device of claim 20, wherein each pair of the one or more pairs of first transistors and the one or more pairs of second transistors has a unique ratio of channel width divided by channel length, wherein each pair of first transistors provides a programming current having a different magnitude than a programming current provided by an other pair of first transistors, and each pair of second transistors provides a programming current having a different magnitude than a programming current provided by an other pair of second transistors.

24. The memory device of claim 20, wherein the at least one mirror current stage includes a number of mirror current stages corresponding to a number of boundaries between adjacent resistance states of the resistive memory element.

25. The memory device of claim 20, wherein the at least one mirror current stage includes a number of mirror current stages corresponding to a number of resistance states of the resistive memory element.

26. The memory device of claim 20, wherein each of the at least one mirror current stage is coupled to a sensing voltage during operation of the sensing circuit.

27. The memory device of claim 26, wherein a potential of the sensing voltage is the first potential.

28. The memory device of claim 27, wherein at least one of the at least one mirror current stage is coupled to a corresponding one of the pairs of second transistors during sensing.

29. The memory device of claim 20, wherein a ratio of channel width divided by channel length of transistors in one of the at least one mirror current stage is different than a ratio of channel width divided by channel length of transistors in an other one of the at least one mirror current stage.

30. The memory device of claim 20, wherein the reference current stage and each of the at least one mirror current stage is coupled to a sensing voltage during operation of the sensing circuit, each of the stages comprising at least one transistor, the gates of the transistors of each of the stages being coupled together.

31. The memory device of claim 30, wherein the reference current stage and each of the at least one mirror current stage is coupled to a sensing voltage each of the stages comprising a pair of transistors, the gates of one transistor of each pair in each stage being coupled together, and the gates of another transistor of each pair in each stage being coupled together.

32. The memory device of claim 20, wherein the write switch and the read switch are incorporated into one multiplexer.

33. A method for operating a circuit, comprising:
selecting an individual memory element of a resistive memory, the memory element being programmed to one of N resistance states, with N being an integer greater than one; and
passing a sensing current through the memory element, the sensing current being a reference current of a current mirror circuit;
generating N−1 mirror currents, the mirror currents being proportional to the reference current, each mirror current having a magnitude that is proportional to a magnitude of the reference current; and
determining, in parallel, from each mirror current the particular one of the N resistance states to which the memory element is programmed.

34. The method of claim 33, including:
sampling voltages corresponding to each of the mirror currents; and
comparing each sampled voltage to a reference voltage.

35. The method of claim 33, including:
routing programming current of a first direction from a potential greater than the intermediate potential, through at least one memory element, to the intermediate potential; and
routing programming current of a second direction from the intermediate potential, through at least one memory element to a potential less than the intermediate potential.

36. The method of claim 33, including:
routing programming currents selected to flow from one of N/2 first potentials, through at least one memory element to the intermediate potential; and
routing programming currents selected to flow from the intermediate potential through at least one memory element to one of N/2 second potentials,
wherein the N/2 first potentials are more positive than the intermediate potential and the N/2 second potentials are more negative than the intermediate potential.

37. The method of claim 33, including:
sensing voltages corresponding to each of the mirror currents; and
comparing the sensed voltages to reference voltages.

* * * * *